(12) United States Patent
Troia et al.

(10) Patent No.: US 12,406,701 B2
(45) Date of Patent: *Sep. 2, 2025

(54) MEMORY COMPONENT FOR A SYSTEM-ON-CHIP DEVICE

(71) Applicant: Lodestar Licensing Group, LLC, Evanston, IL (US)

(72) Inventors: Alberto Troia, Munich (DE); Antonino Mondello, Messina (IT)

( * ) Notice: Subject to any disclaimer, the term of this patent is extended or adjusted under 35 U.S.C. 154(b) by 0 days.

This patent is subject to a terminal disclaimer.

(21) Appl. No.: 18/227,727

(22) Filed: Jul. 28, 2023

(65) Prior Publication Data
US 2024/0071424 A1    Feb. 29, 2024

Related U.S. Application Data

(63) Continuation of application No. 17/745,583, filed on May 16, 2022, now Pat. No. 11,715,498, which is a continuation of application No. 16/624,438, filed as application No. PCT/IB2019/000484 on May 31, 2019, now Pat. No. 11,335,383.

(51) Int. Cl.
*G11C 5/04* (2006.01)
*G11C 5/02* (2006.01)
*G11C 5/06* (2006.01)

(52) U.S. Cl.
CPC ............... *G11C 5/025* (2013.01); *G11C 5/04* (2013.01); *G11C 5/06* (2013.01); *G11C 2207/105* (2013.01)

(58) Field of Classification Search
CPC .. G11C 5/025; G11C 5/04; G11C 5/06; G11C 2207/105

USPC ...................................................... 365/51, 59
See application file for complete search history.

(56) References Cited

U.S. PATENT DOCUMENTS

| | | |
|---|---|---|
| 7,562,190 B1 | 7/2009 | Koster |
| 9,697,874 B1 | 7/2017 | Asnaashari et al. |
| 9,761,564 B1 | 9/2017 | Shibata |
| 9,847,319 B2 | 12/2017 | Song |
| 10,423,541 B1 | 9/2019 | Levin |
| 10,820,419 B2 | 10/2020 | Seo |
| 2009/0057915 A1 | 3/2009 | Koike |
| 2009/0216450 A1 | 8/2009 | Sakamoto |
| 2011/0025699 A1 | 2/2011 | Ogawa |
| 2012/0018885 A1 | 1/2012 | Lee et al. |
| 2012/0054422 A1 | 3/2012 | Gu et al. |

(Continued)

FOREIGN PATENT DOCUMENTS

| | | |
|---|---|---|
| CN | 103098203 A | 5/2013 |
| JP | 2016219655 A | 12/2016 |

OTHER PUBLICATIONS

Partial International Search Report and Provisional Written Opinion from related International application No. PCT/IB2019/000484, dated Feb. 4, 2020, 18 pages.

*Primary Examiner* — Michael T Tran
(74) *Attorney, Agent, or Firm* — Brooks, Cameron & Huebsch, PLLC

(57) ABSTRACT

The present disclosure relates to a memory component for a System-on-Chip (SoC) structure including at least a memory array and at least a logic portion for interacting with the memory array and with the SoC structure wherein the memory component is a structurally independent semiconductor device coupled to and partially overlapping the SoC structure.

20 Claims, 19 Drawing Sheets

(56) References Cited

U.S. PATENT DOCUMENTS

| | | |
|---|---|---|
| 2013/0119527 A1 | 5/2013 | Luo et al. |
| 2014/0077391 A1 | 3/2014 | Kikuchi |
| 2014/0264812 A1* | 9/2014 | Chang ................ H01L 25/0657 |
| | | 257/686 |
| 2014/0367844 A1 | 12/2014 | Hooper et al. |
| 2015/0043298 A1 | 2/2015 | Hayashi |
| 2015/0069633 A1 | 3/2015 | Iwamoto |
| 2015/0076640 A1 | 3/2015 | Iwafuchi |
| 2015/0133193 A1 | 5/2015 | Stotler |
| 2016/0315071 A1* | 10/2016 | Zhai ........................ H01L 24/73 |
| 2017/0243858 A1* | 8/2017 | Chou ................ H01L 23/3135 |
| 2017/0315944 A1 | 11/2017 | Mayer |
| 2018/0005670 A1 | 1/2018 | Lee |
| 2018/0096971 A1* | 4/2018 | Pappu ...................... H01L 25/18 |
| 2018/0138145 A1 | 5/2018 | Lin |
| 2018/0145104 A1 | 5/2018 | Kim |
| 2018/0233452 A1 | 8/2018 | Lin |
| 2018/0350765 A1 | 12/2018 | Chang |
| 2019/0004896 A1 | 1/2019 | Tokoyoda |
| 2019/0164905 A1 | 5/2019 | Hsieh |
| 2019/0198489 A1 | 6/2019 | Kim |
| 2019/0287939 A1 | 9/2019 | Takemoto |
| 2019/0333836 A1 | 10/2019 | Lin |
| 2020/0075567 A1 | 3/2020 | Collins |
| 2020/0098727 A1* | 3/2020 | Mallik ..................... H01L 24/73 |
| 2020/0105719 A1* | 4/2020 | Li ............................ H01L 25/50 |
| 2021/0242170 A1* | 8/2021 | Dabral ................ H01L 25/0652 |
| 2022/0101895 A1* | 3/2022 | Jo ........................ G11C 7/1084 |
| 2023/0147765 A1* | 5/2023 | Kim ..................... G11C 11/4085 |
| | | 365/210.1 |
| 2023/0187397 A1* | 6/2023 | Or-Bach ................ H01L 25/18 |
| | | 257/690 |
| 2024/0194265 A1* | 6/2024 | Choo ..................... H10B 43/35 |

* cited by examiner

MEMORY COMPONENT FOR A SYSTEM-ON-CHIP DEVICE

PRIORITY INFORMATION

This application is a Continuation of U.S. application Ser. No. 17/745,583, filed on May 16, 2022, now issued as U.S. Pat. No. 11,715,498, which is a Continuation of U.S. application Ser. No. 16/624,438 filed on Dec. 19, 2019, now issued as U.S. Pat. No. 11,335,383 on May 17, 2022, which is a National Stage Application under 35 U.S.C. § 371 of International Application Number PCT/IB2019/000484, filed on May 31, 2019, the contents of which are incorporated herein by reference.

DESCRIPTION

The present invention relates to memory devices and more particularly to a memory component allowing to replace an embedded memory portion in SoC devices.

BACKGROUND

A system on a chip or SoC is a semiconductor integrated circuit that integrates all components of a computer or other electronic systems. These components typically include a central processing unit (CPU), memory portions, input/output ports and secondary storage components, all on a single semiconductor substrate.

A SoC device may contain digital, analog, mixed-signal, and often radio frequency signal processing functions, depending on the application. As they are integrated on a single electronic substrate, a SoC device may consume much less power and take up much less area than multi-chip designs with equivalent functionality. SoC devices are nowadays very common in the mobile computing, in embedded systems and in the Internet of Things.

Particularly in the automotive field there is a felt need to dispose of SoC devices including controllers, memories and connections with many external sensors and actuators. Moreover, the controllers of these SoC devices are required to have a long-life term and an extremely high reliability and to work with the memory portions embedded in the SoC device with a low initial latency time and with the maximum throughput possible.

Non-volatile Flash memories are today one of the fundamental building blocks in modern electronic systems, including the SoC devices for automotive applications and specifically for Real Time Operating Systems, i.e. RTOS. Their performance in terms of speed, consumption, alterability, nonvolatility and the increasing importance of system reconfigurability have pushed up to now for flash memory integration in System-on-Chip devices.

However, flash integration introduces many issues both at system and at circuit/technology levels that need a careful design. From the system point of view, several aspects are involved in the choice of the flash memory type to be integrated in the SoC device; the most important ones, depending on the specific applications and requirements, are their yield, cost, power consumption, reliability and performance requirements.

Moreover, embedded memories in SoC devices is difficult to be managed when the lithography node is below 28 nm and when the embedded macro flash can be the biggest portion of the SoC.

DETAILED DESCRIPTION

With reference to those figures, apparatuses and methods involving a non-volatile memory device or component and a host device for such a memory device will be disclosed herein.

Figure 1:
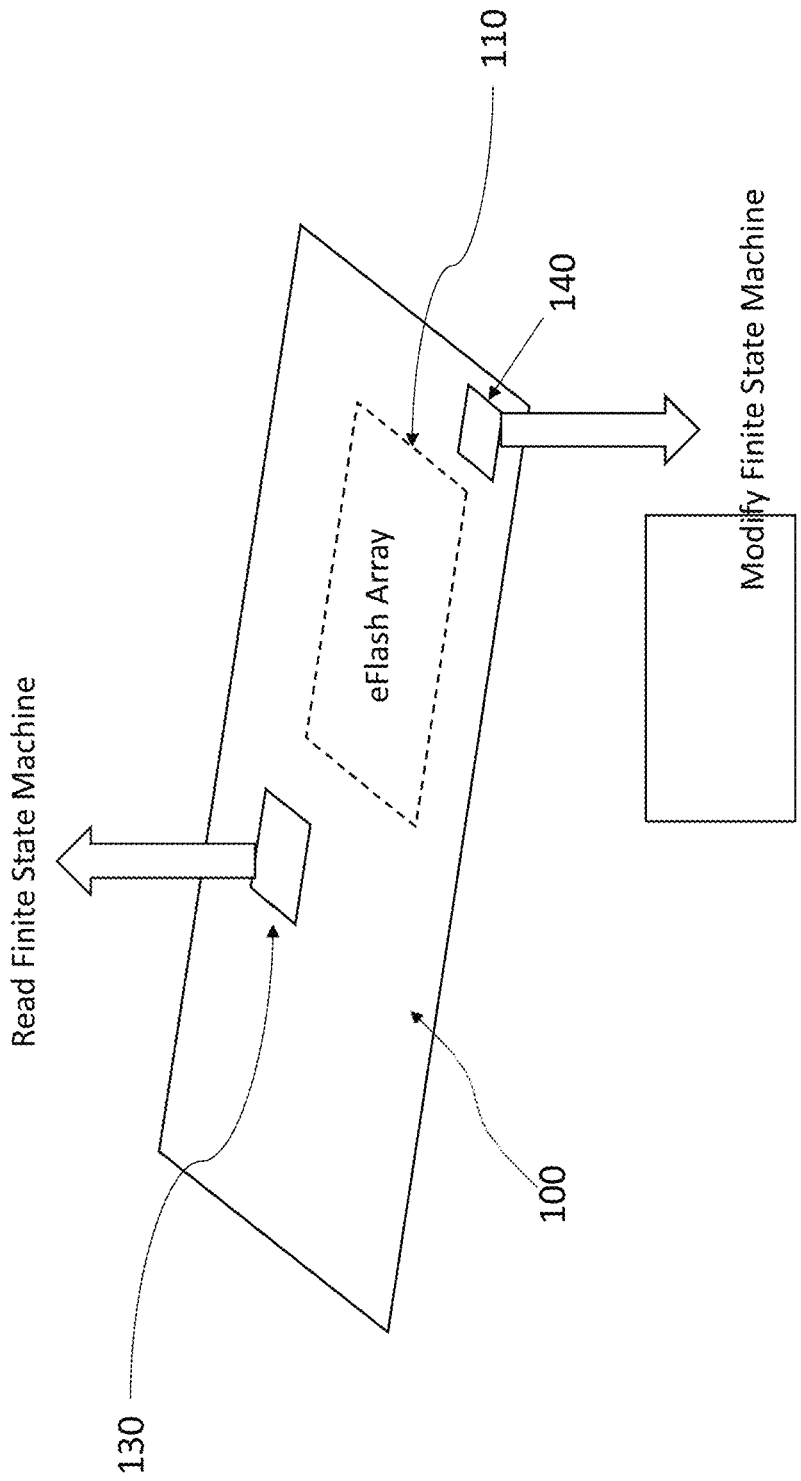
FIG. 1 is a schematic and perspective view of a System-on-Chip device according to the prior art and including an embedded memory portion.

The host device shown in the prior art FIG. 1 can be a System-on-Chip with an embedded memory component or a more complex electronic device including a system coupled to a memory device, as will appear from the description of other embodiments of the present disclosure made with reference to other figures.

As an alternative, the system may be an external controller in communication with the System-on-Chip but for the purpose of the present disclosure we will refer to the host device or to the SoC as entities in communication with the memory component.

For instance, the system can be one of a number of electronic devices capable of using memories for the temporary or persistent storage of information. For example, a host device can be a computing device, a mobile phone, a tablet or the central processing unit of an autonomous vehicle.

Embodiments of the present disclosure as well as the various features and advantageous details thereof are explained with reference to the non-limiting examples that are illustrated in the accompanying drawings and detailed in the following description.

Descriptions of well-known components and processing techniques are omitted so as to not unnecessarily obscure the embodiments herein. The examples used herein are intended merely to facilitate an understanding of ways in which the embodiments herein may be practised and to further enable those of skill in the art to practice the embodiments herein. Accordingly, the examples should not be construed as limiting the scope of the embodiments herein.

Non-volatile memories retain their contents when power is switched off, making them good choices for storing information that is to be retrieved after a system power-cycle. However, a non-volatile memory is typically slower than a volatile memory, and often it has more complex writing and erasing procedures.

A flash memory is a type of non-volatile memory that retains stored data without a periodic refresh thanks to the electricity. Flash memories can be erased in blocks instead of one byte at a time. Each erasable block of memory comprises a plurality of non-volatile memory cells arranged in a matrix of rows and columns. Each cell is coupled to an access line and/or a data line. The cells are programmed and erased by manipulating the voltages on the data lines.

Currently, the technology of the complex semiconductor structures known as System-on-Chips provides the integration of at least an embedded non-volatile memory, for instance up to 128 Mbit.

FIG. 1 shows an example of a known solution of a complex System-on-Chip (SoC) structure 100 including a large circuit portion occupied by a conventional embedded non-volatile memory portion 110.

This embedded non-volatile memory portion 110 includes an array of Flash memory cells indicated in FIG. 1 as eFlash Array.

In order to read the memory cells of the Array, it is provided a dedicated circuit portion 130 including an optimized Read Finite State Machine that is used to ensure high read performance, such as branch prediction, fetch/pre-fetch, interrupt management, error correction and so on.

In order to write and erase the memory cells of the Array, it is provided a dedicated logic circuit portion 140 including a simplified Reduced Instruction Set Computer (RISC) controller or a Modify Finite State Machine which is the logic circuit for handling the programming and erasing algorithms.

While being advantageous under many aspects, the System-on-Chips including large memory arrays may suffer for many drawbacks since the memory portion is realized with a process not specifically designed for memories and possible defects of the memory array may compromise the life or the functioning of the whole SoC structure. Moreover, if a SoC has already a flash array as an embedded memory it would be desirable to have also an extended non-volatile memory as a sort of far memory.

According to embodiments of the present disclosure, to improve the performances of the whole SoC structure the old memory portion 110 has been realized as an independent memory device with a technology specifically dedicated to the manufacturing of flash memory devices. This new memory component is associated and linked to the SoC structure partially overlapping such a structure while the corresponding semiconductor area of the SoC structure has been used for other logic circuits and for providing support for the overlapping structurally independent memory portion.

It is herein disclosed a non-volatile memory structure that can improve the access time. In any case, the System-on-Chip and the associated memory device are realized on a respective die obtained by a different lithography process.

Figure 2:
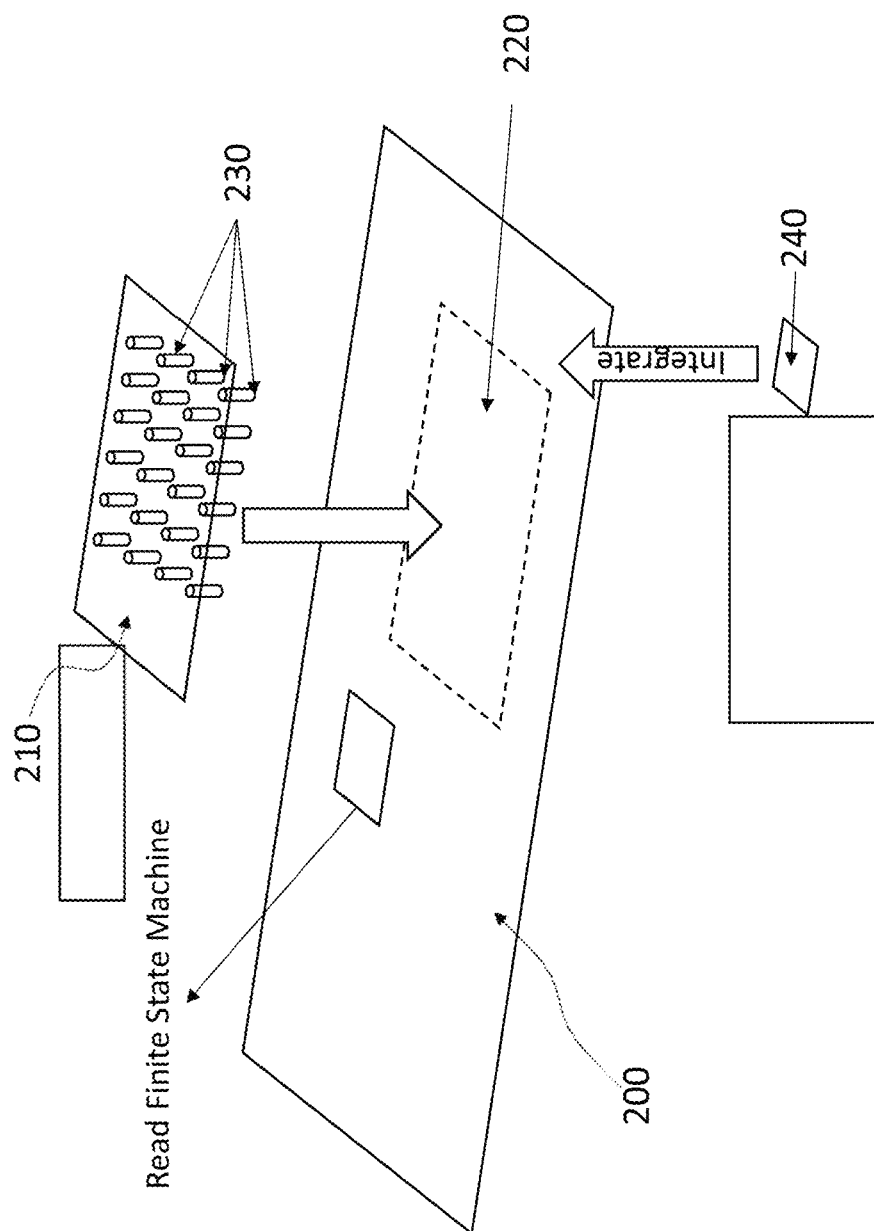
FIG. 2 is a schematic and perspective view of a System-on-Chip device according to the present disclosure and including a memory component replacing the embedded memory portion of the prior art devices.

As shown in FIG. 2, according to the present disclosure, we may consider that the memory portion (i.e. the old reference number 110 of FIG. 1) has been removed from the SoC structure thus allowing to use the corresponding semiconductor area for other logic circuits and for providing support for a structurally independent memory component 210 partially overlapping a SoC structure 200.

The memory component 210 is structured as a stand-alone device realized in a single die with a technology specifically dedicated to the manufacturing of flash memory devices. The memory component 210 is an independent structure but it is strictly associated to the host device or to the SoC structure. More particularly, the memory device 210 is associated and linked to the SoC structure partially overlapping such a structure while the corresponding semiconductor area of the SoC structure has been used for other logic circuits and for providing support for the partially overlapping structurally independent memory device 210 for instance through a plurality of pillars 230 or other similar alternative connections such as bumping balls or with a technology similar to Flip-Chip.

The Flip Chip technology is also known with its abbreviation C4 (Controlled Collapse Chip Connection) and is a method for interconnecting semiconductor devices, such as IC chips and/or microelectromechanical systems (MEMS), to external circuitry with solder bumps that have been deposited onto the chip pads. The solder bumps are deposited on the chip pads on the top side of the wafer during the final wafer processing step.

The present disclosure relates to a method for manufacturing a memory component for a System-on-Chip (SoC) structure including a plurality of interconnecting pads, the method comprising at least the following steps:
  providing a structurally independent semiconductor memory component including a memory array with at least a logic portion for interacting with the memory array and with the SoC structure;
  providing a plurality of interconnecting pads located on a surface of the memory component;
  facing the surfaces of the SoC structure and the memory component comprising the interconnecting pads;
  coupling the memory component to the SoC structure aligning and connecting said plurality of interconnecting pads with the corresponding plurality of pads of the SoC structure.

In order to mount the chip to external circuitry (e.g., a circuit board or another chip or wafer), the chip is flipped over so that its top side faces down, and aligned pads-to-pads so that its pads are aligned with matching pads on the external circuit. Then the solder is reflowed to complete the interconnections.

This technology is different from wire bonding, in which the chip is mounted upright and wires are used to interconnect the chip pads to external circuitry.

The final configuration will be a face-to-face interconnection SoC/Flash Array with the sense amplifiers will be connected to the SoC in a Direct Memory Access configuration.

At the end, the memory device is manufactured according to the user's needs in a range of values that may vary according to the available technology, for instance from at least 128 Mbit to 512 Mbit or even more without any limitation for the applicant's rights. More specifically, the proposed external architecture allows to overpass the limit of the current eFlash (i.e. embedded flash technology) allowing the integration of bigger memory, as it can be 512 Mbit and/or 1 Gbit and/or more depending on the memory technology and technology node.

The result of this solution is the new SoC structure of FIG. 2, strictly associated with the new structurally independent memory component 210 that is coupled to the SoC structure 200, for instance through a plurality of coupling elements 230, such as pillars, as well as through bumping balls, flip-chip technology, face-to-face interconnection (coils) and the like. In a preferred embodiment, the coupling elements are pillars 230, which are arranged in the semiconductor area 220 previously dedicated to the embedded memory portion 110 of FIG. 1.

In one embodiment of the present disclosure, the memory component 210 for the SoC structure 200 includes at least a memory portion and a logic circuit portion for interacting with the memory portion and with the SoC structure 200, wherein the memory component 210 is a structurally independent semiconductor device coupled to and partially overlapping the System-on-Chip structure 210. A logic circuit 240 is integrated in the SoC structure 200 to cooperate with the logic circuit portion of the memory component 210.

More generally, the memory component 210 has a minor size if compared with the larger size of the SoC structure 200, the term "partially overlapping" meaning that the memory component 210 covers only partially or not completely the area of the SoC structure 200. However, even a memory component 210 of a larger size may be supported and interconnected with the pads of the SoC structure keeping the position and dislocation of the its interconnection or interconnecting pads.

The coupling between the SoC structure 200 and the memory component 210 is made by interconnecting a plurality of respective pads or pin terminals that are faced one toward the other in a circuit layout that keeps the alignment of the pads even if the size of the memory component 210 is modified.

In one embodiment of the present disclosure, the arrangement of the pads of the memory component 210 has been realized on a surface of the memory component 210. More specifically, the pads are arranged over the array so that, when the memory component 210 is reversed, its pads are faced to corresponding pads of the SoC structure 200. The semiconductor area 220 that in known System-on-Chip devices 100 was occupied by the embedded non-volatile memory portion is dedicated to the housing of the interconnecting pads corresponding to the pads of the memory component 210.

Even a memory component of a larger size may be supported and interconnected with the pads of the SoC structure 200, keeping the position and dislocation of its interconnecting pads.

In the contest of the present disclosure, the SoC structure 200 has its top side linked with the reversed side of the memory component 210, the pads of the SoC structure 200 being aligned with matching pads of the reversed memory component. As an alternative, the structurally independent memory component 210 may be coupled to the SoC structure 200 in a face-to-face manner. If a face-to-face coupling is adopted, a stack of memory components of the same size could be overlapped realizing a stack structure, wherein each independent component is addressed by the logic circuitry of the SoC structure 200 though a corresponding identification address.

The semiconductor area 220 previously occupied by the embedded memory portion 110 is now used to implement additional functionalities and to prepare the semiconductor device for a Logic Over Pads technology. The expression "Logic Over Pads" means providing logic circuitry overlapping some connection pads located internally to a first or base layer represented by a complete semiconductor product, i.e. the SoC structure 200.

The memory component 210 thus represents an upper layer coupled and interconnected to the base SoC structure 200. The memory component 210 partially overlaps the SoC structure surface covering at least the semiconductor area 220 previously occupied by the embedded memory portion 110. However, the memory component 210 has a greater capacity can cover a larger semiconductor area than the semiconductor area 220. In this respect, the size of the overlapping memory component 210 is larger than size of the overlapped semiconductor area 220 dedicated to the interconnections with such covering memory component 210. In other words, the area of the overlapping memory component 210 is larger than the semiconductor area 220 of the SoC structure 200 dedicated to the interconnecting pads for the memory component 210.

Moreover, for a better functioning of the SoC structure 200, even the logic circuit portion 140 of FIG. 1 (which in the SoC device 100 of FIG. 1 included the Modify Finite State Machine or RISC) can be removed and reorganized in association with the memory component 210. For supporting the write and erase phases performed on the larger memory component 210, a Modify Finite State Machine or RISC 240 has migrated into the memory component 210.

As previously indicated, the memory component 210 includes the logic circuit portion for interacting with the memory portion and with the SoC structure 200.

The separation and optimization of the logic circuit portion further allows to enhance the functionality of the whole SoC structure 200, thus obtaining an independent semiconductor memory component 210 coupled to the SoC structure 200.

This independent semiconductor memory component 210 therefore includes at least the memory portion (preferably a non-volatile memory portion) and the associated modify finite state machine 240, both incorporated into a semiconductor product that is coupled to the SoC structure 200. In this case, the logic embedded in the SoC is the read logic: fetch of the data, correction of the data, elaboration and execution.

As will appear in the following of the present disclosure, a DMA capability is provided to the memory component 210 with an interface logic JTAG TAP using modified JTAG cells as well as a flexible TDI, secure access, address buffers and other features for handling the communication with the SoC structure 200.

In other words, both the non-volatile memory portion and the associated logic circuit portion are integrated in the independent semiconductor memory component 210 that is coupled and connected to the SoC structure 200.

In the content of the present disclosure the SoC structure 200 has its top side that is linked with the reversed side of the memory component 210 with the pads of the SoC structure 200 that are aligned with matching pads of the reversed memory component 210. Obviously, it could be the opposite according to the adopted space reference.

As an alternative, the structurally independent memory component 210 may be coupled to the SoC structure 200 in a face-to-face manner.

If a face-to-face coupling is adopted a stack of memory components 210 of the same size could be overlapped realizing a stack structure wherein each independent component is addressed by the logic circuitry of the SoC structure 200 though a corresponding identification address.

What it is important for the principle of the present disclosure is the idea that the semiconductor area previously occupied by the embedded memory array 110 is now used to implement additional functionality and to prepare the semiconductor device for a Logic Over Pads technology. For Logic Over Pads it is intended the idea of providing logic circuitry overlapping some connection pads located internally to a first or base layer represented by a complete semiconductor product, i.e. the SoC structure 200. However, it should be kept in mind that the SoC structure could even keep an embedded Flash portion realized with the SoC technology but could need an extended memory portion as a sort of far memory strictly physically associated.

The memory component 210 will thus represent an upper layer coupled and interconnected to the base SoC structure 200. The memory component 210 partially overlaps the SoC structure surface in the sense that it covers at least the semiconductor area previously occupied by the embedded memory array 110. However, the memory component 210 has a greater capacity and covers a larger semiconductor area than the semiconductor area 110.

In this respect, we may say that the size of the overlapping memory component 210 may be larger than size of the overlapped semiconductor area dedicated to the interconnections with the covering memory component 210. In this respect, the area of the overlapping memory component 210 is larger than the semiconductor area of the SoC structure 200 dedicated to the interconnecting pads for the memory component 210. However, even an opposite situation may apply.

Figure 3:
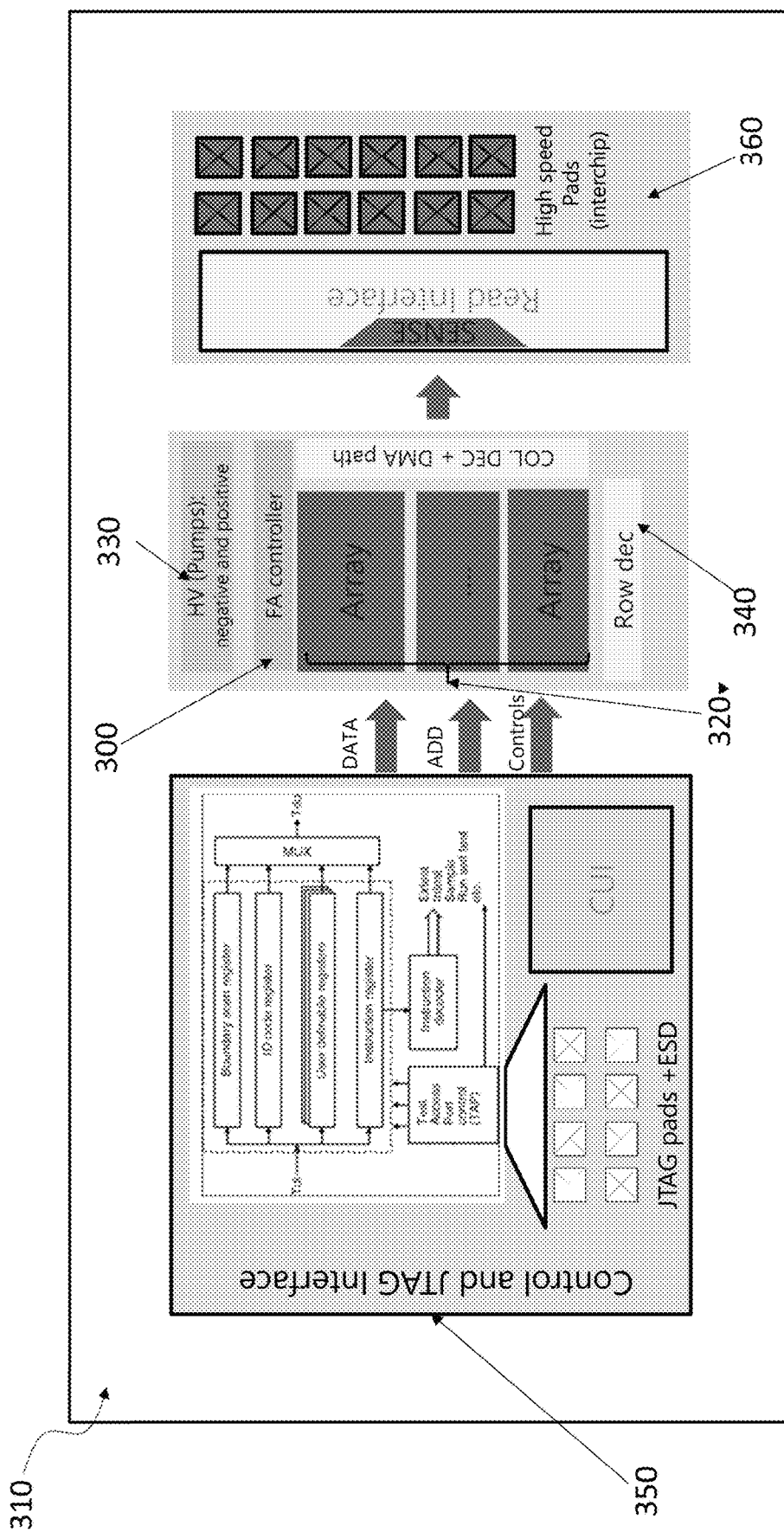
FIG. 3 is a schematic view of the memory component according to the present disclosure.

Now, with more specific reference to the example of FIG. 3, the main structure of the memory component 310 according to an embodiment of the present disclosure will be disclosed, wherein the reference 310 of FIG. 3 corresponds to the reference 210 of FIG. 2.

The memory component 310 includes at least: an TO circuit, a micro-sequencer, an array of memory cells 320, an array peripheral, a charge pump architecture, address decoders, sense amplifiers and corresponding latches, a service logic to connect all the parts of the memory, and a command user interface, for instance a CUI block.

The array of memory cells 320 includes non-volatile Flash memory cells.

In one embodiment of the present disclosure, the memory component 310 implements a Direct Memory Access type of memory to replace the embedded memory array of known SoC devices.

Moreover, the proposed idea provides for the implementation of the memory component 310 in a "Known Good Die" (KGD) form factor or bare die, that allows connecting the sense amplifier outputs, except for a latch structure in the middle, directly with a controller of the SoC structure.

Strategies for obtaining the KGD form factor have been based on taking advantage of the existing infrastructure for test and burn-in of traditionally packaged components. This minimizes the amount of hardware, tooling, or insertions that add cost to the bare die products.

Moreover, a JTAG interface 350 is adopted for the test of the memory component 310, allowing the re-use of the testing tooling. Therefore, the memory component 310 also comprises a JTAG logic 350. This JTAG interface 350 will be disclosed later in more details with reference to FIG. 8.

Figure 8:
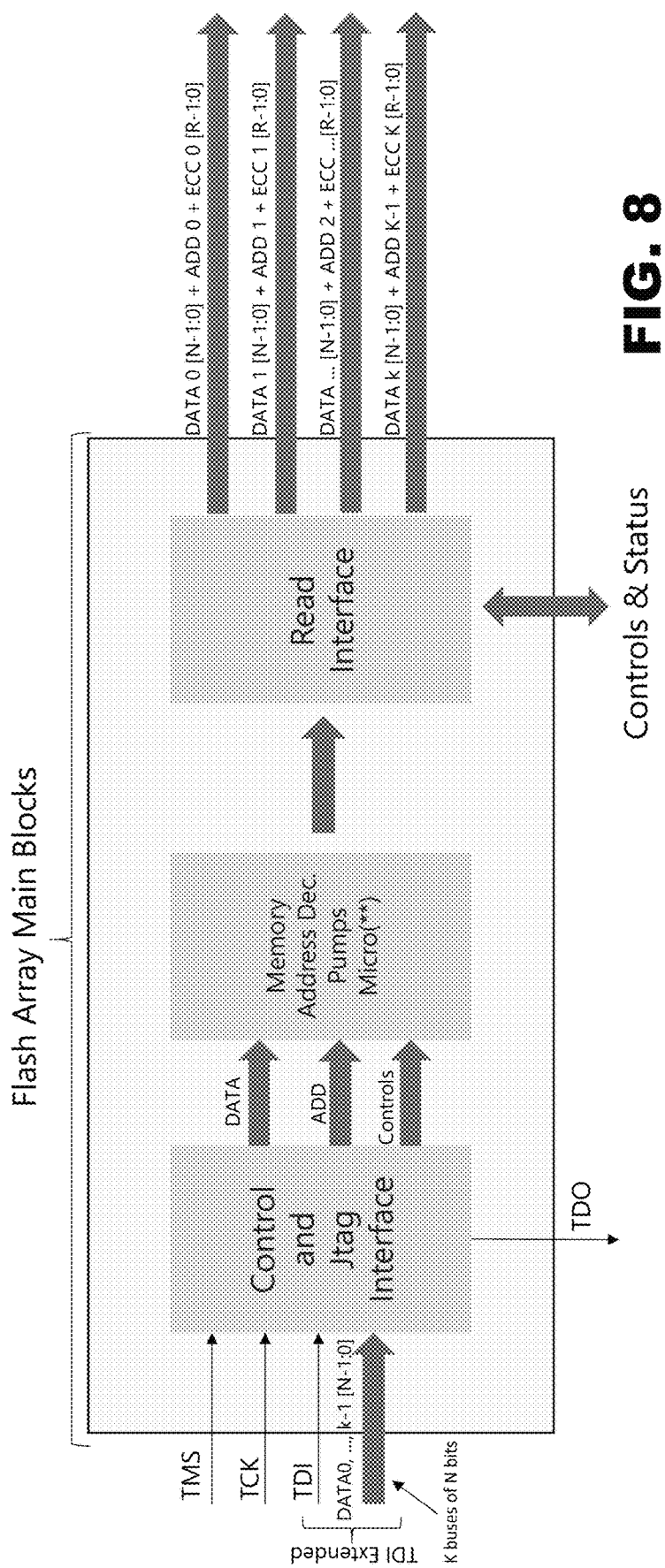
FIG. 8 shows a schematic view of a portion of the non-volatile memory component of FIG. 2 including a layout configuration according to the present disclosure.

In more details, each memory array includes at least a JTAG interface 350 receiving as inputs standard JTAG signals: TMS, TCK, TDI as well as data from a memory page, as shown in FIG. 8. According to embodiments of the present disclosure, an extended TDI is used as flexible TDI. The flexibility is due to the fact that the number of parallel bits working as TDI are depending from the selected registers, i.e. K (four, in the example) lines for the instruction register, M lines for the address register, N lines for the data register, etc. while TDI comes from the JTAG protocol that uses TDI as name on the signal used to fill the registers.

This JTAG interface 350 produce as output data, addresses and control signals that are transferred to a memory address decoder 340 and also to the internal flash controller 300 to perform modify, testing, verification operations.

The activity of the decoder 340 is allowed by charge pumps 330 structured to keep secret the voltages and timings to manage the array. The decoding phase drives the data lines while the charge pumps provide the high voltage routed by the address decoder in the selected data lines.

This decoder 340 addresses the selected memory block. The address decoder is connected to the array to select the proper data lines, i.e. row and column for each super page. the read, modify and any other operations are using the address decoder to properly address bytes in the memory array.

A memory block is connected to the sense amplifiers and the sense amplifiers of the read interface 360 are connected to the SoC device 200 using the modified JTAG cells. The communication channel between the flash array blocks and the SoC device 200 is represented by a control and status bus.

The output of the read interface 360 is represented by an extended page including the combined string of data cells+address cells+ECC cells. The write operation also drives the three components (data cells+address cells+ECC cells) of the extended page; the ECC and the address cells serves as a safety mechanism to ensure the low probability to make mistakes.

The total amount of Bits would involve in the example disclosed herewith N+M+R Bits, for instance one-hundred-sixty-eight pads per channel in the implementation disclosed herewith.

The memory component 310 uses the interconnection pads and the logic circuit portion to allow the interconnection with the SoC structure 200.

The final configuration will be a face-to-face interconnection SoC/Flash Array, wherein the sense amplifiers of the memory component 310 will be connected to the SoC in a Direct Memory Access configuration. The interconnections also include the JTAG interface and control pins for testing and other purposes.

In this manner it is possible to keep relatively low the number of required interconnections, for instance in this particular disclosure within the range of 600 to 650 pads but a larger of lower number could depend on the implementation.

The memory array 320 of the memory component 310 is built as a collection of subarrays. The scan chains can be connected to form a unique shift register to proper test the interconnections.

The advantage of this architecture is that it is very scalable, wherein expanding and/or reducing the density of the final device translates only in mirroring a sub-array and providing the corresponding interconnections in a very scalable manner. The memory can be expanded also increasing the memory size per sub array, without enlarging the number of channels for the SoC.

The Direct Memory Access allows to reduce the final latency that the SoC can experience when reading the data.

Advantageously according to the present disclosure, the memory component 310 is equipped with a controller 300 of the flash array 320 (hereinafter referred to as Flash array controller), said flash array controller 300 having an architecture that allows sharing some flash array resources with the SoC controller without compromising the secrecy of certain information stored therein (for example, algorithms, flash array voltages, currents, and more in general process information) and guarantees eventual customer return management.

Figure 4:
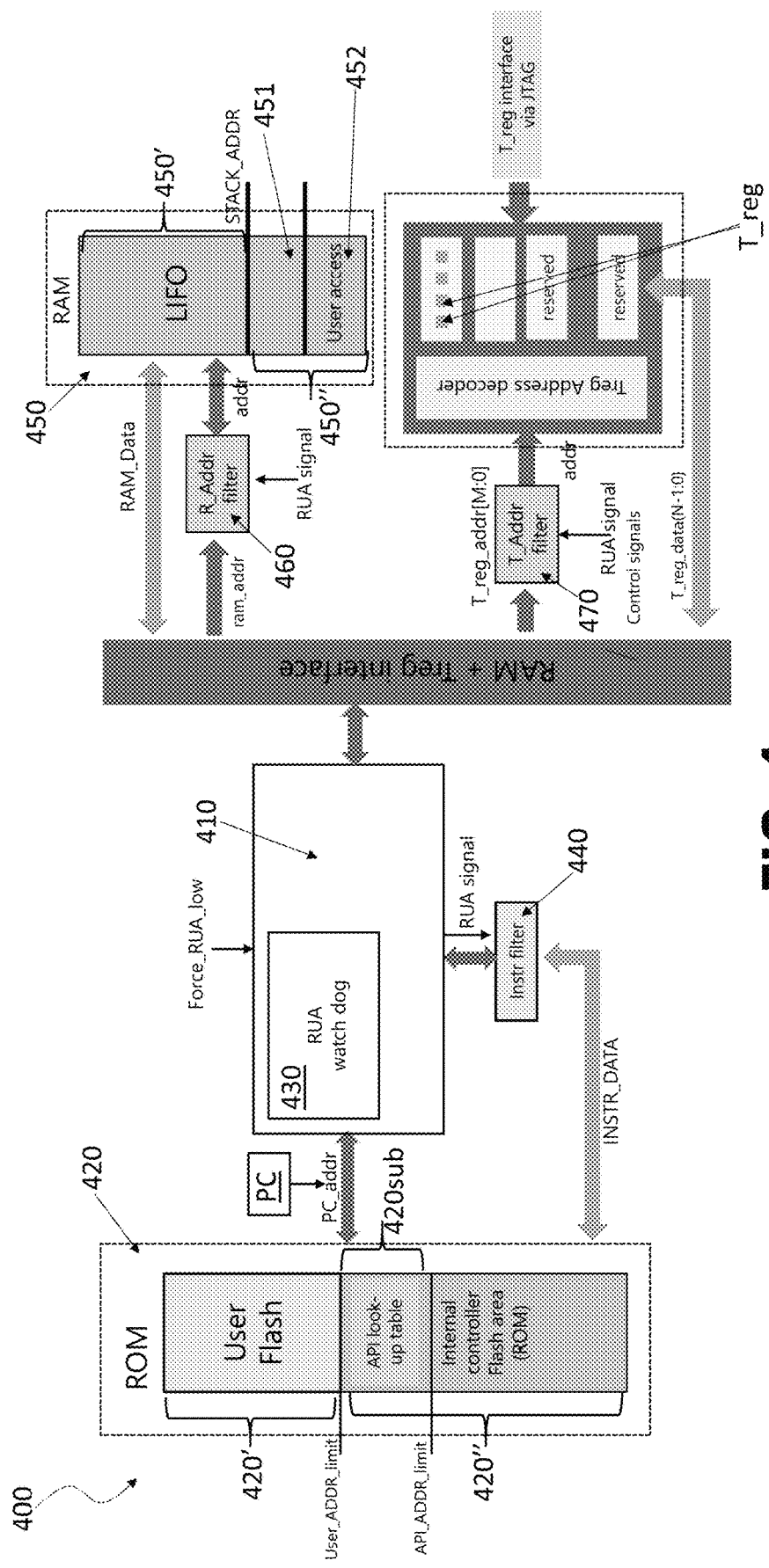
FIG. 4 schematically shows an architecture of a controller of the memory component according to the present disclosure.

FIG. 4 is a schematic view of the architecture of a controller 400 according to the present disclosure, where the controller 400 corresponds to the controller 300 of FIG. 3.

The controller 400 comprises a processing unit 410 and a memory unit 420 operatively connected with the processing unit 410.

According to an embodiment of the present disclosure, as shown in FIG. 4, the memory unit 420 is a Flash memory array acting as ROM. The advantage of this is that it can be updated in case of needs or upgrade and such an update can be secure, over the air. Therefore, the memory is partially addressable (readable/writable) from outside the Flash array controller 400, i.e. from the SoC controller, as it will be described into details in the following.

More in particular, the ROM like structure comprises at least two different flash blocks logically mapped as a continuous address space. In other words, the ROM is divided into a first area 420' and into a second area 420" mapped as a continuous address space, which are physically separated and can be erased independently.

As shown in FIG. 4, the processing unit 410 includes a control portion 430 (which is also referred to as ROM User Area—RUA—watch dog) configured to allow a selective and guided access of the user to the areas of the ROM, as it will be described in the following.

According to an embodiment of the present disclosure, the user can write and store his own firmware in the first area 420' of the ROM. Therefore, the first area 420' comprises the user firmware and can be accessed by an external controller, for example by the controller of the SoC.

On the other hand, the second area 420" is configured to store the flash array controller firmware (i.e. the internal controller firmware managing the operation of the system and written by the manufacturer) and cannot be directly accessed by the user. The second area 420" can thus be written only by the manufacturer and the user cannot directly access to it and cannot directly use and change the firmware embedded therein.

Due to the above separation of the first and second area, the ROM of the controller 400 of the present disclosure is thus partially addressable (readable/writable) by the SoC controller.

In order to correctly identify which instruction of the user firmware should be retrieved for execution, the controller 400 includes a register that identifies which firmware instruction to retrieve and execute next, such a register being commonly referred to as a program counter (PC).

The control portion 430 of the processing unit 410 is connected to the program counter PC via an address bus so that it can capture the value of the program counter PC and read the memory address of the instruction to be executed, such address being herein referred to as PC_addr.

The processing unit 410, in particular the control portion 430, is then configured to compare the memory address received from the program counter PC with a reference value (or threshold address, hereinafter indicated as User_ADDR_limit) that has been previously stored in the processing unit 410. The reference value User_ADDR_limit can be set by the manufacturer according to the needs and/or circumstances.

According to an embodiment of the present disclosure, the reference value User_ADDR_limit is a ROM memory address delimiting the first area 420' from the second area 420". Preferably, the reference value User_ADDR_limit belongs to the first area 420' of the ROM and is the memory address at the separation between said first area 420' and the second area 420" of the ROM.

In particular, if the memory address PC_addr received from the program counter PC belongs to the first area 420' of the memory unit 420 (i.e. it is associated with the first area 420'), the processing unit 410, in particular the control portion 430, generates a corresponding output signal adapted to disable actions associated with the instruction of the user firmware to be executed and corresponding to the memory address PC_addr, thus applying a restriction to said instruction of the user firmware.

In this way, the controller 400 is able to recognize that the instruction to execute is not an instruction of the controller firmware written by the manufacturer, but an instruction of the user firmware having a lower (or in general different) priority level and therefore having some restrictions, so that part of the manufacturer code in the second area 420", as well as other regions, cannot be directly accessed by the external user.

More in particular, the generated output signal is adapted to trigger dedicated filtering blocks of the controller 400, said filtering blocks being configured to act on the instructions of the user firmware (e.g. on the destination addresses of such instructions) for preventing the execution of some actions associated with said instructions, in this way applying the above-indicated restrictions to the instructions of the user firmware.

The above-mentioned output signal of the processing unit 410 is hereinafter also indicated as RUA signal.

More specifically, in one embodiment of the present disclosure, the RUA signal is generated by a state machine in the processing unit 410, such signal assuming different values based on the above comparison of the memory address PC_addr with the reference value User_ADDR_limit. For example, the RUA signal can be high (e.g. equal to 1) when the memory address PC_addr associated with the user instruction is an address of the first area 420' of the ROM, and can be low (i.e. equal to 0) when the memory address PC_addr is an address of second first area 420" of the ROM.

In an embodiment of the present disclosure, the processing unit 410, in particular its control portion 430, is configured to generate and assert the RUA signal when the value of the program counter PC is lower than or equal to the reference value User_ADDR_limit, i.e. when the program counter PC is inner the ROM area shared with the external controller (namely, inner the first area 420' of the ROM). The control portion 430 of the processing unit 410 is thus configured to verify whether PC_addr≤User_ADDR_limit.

Therefore, based on the above comparison between the captured memory address PC_addr of the program instruction and the reference value User_ADDR_limit, it is possible to enable/disable actions associated with the program instructions of the user firmware, in particular thanks to the RUA signal generated by the processing unit 410.

As it will be disclosed in the followings in grater detail, the actions associated with the program instructions of the user firmware may be for example the access to specific portions of the ROM, as well as the selection of particular addresses of a RAM, or also the selection of particular test registers implemented in the memory component associated with the controller 400. The above-mentioned filter blocks activated by the RUA signal (i.e. activated when PC_addr≤User_ADDR_limit) are therefore able to recognize and to act on the particular destination address of said instructions in order to prevent said actions.

Advantageously according to a preferred embodiment of the present disclosure, the user firmware is able to use some subroutines of the controller firmware without having a directly access and knowledge of the details of such subroutines.

In particular, in order to interface the user firmware of the first area 420' with the controller firmware of the second area 420", the second area 420" of the memory unit 420 comprises a plurality of Application Programming Interfaces (APIs). According to an embodiment of the present disclosure, it is not possible to directly call an API of the second area 420" by the user firmware, i.e. directly from the first area 420', so that some reserved information is not shared with the user. The API are called as described in the following.

More in particular, the second area 420" of the ROM is further configured to store a plurality of Call instructions that can be called by the user firmware, each of these Call instructions being associated with a specific address of said second area 420". The Call instructions interrupt the flow of the program by passing control to a subroutine of the controller firmware. In this way, the plurality of Call instructions defines a sub-area 420sub within the second area 420" of the memory unit 420, this sub-area 420sub storing all the needed Call instructions. The Call instructions of this sub-area 420sub are adapted to call all the API contained in the second area 420" of the ROM and therefore are adapted to interface the user firmware of the first area 420' with subroutines of the controller firmware of the second area 420".

The API in the second area 420" are written by the manufacturer and the user cannot directly access it and cannot change it. In this way, through the Call instructions of the sub-area 420sub, the user program in the first area 420' can interact with the controller program in the second area 420" without a direct access to the latter.

The plurality of Call instructions in the sub-area 420sub of the second area 420" defines an API look up table in said second area 420" of the memory unit 420, this API lookup table being a collection of Call instructions adapted to implement an interface for the external user.

The addresses of the Call instructions stored in the sub-area 420sub of the ROM second area 420" are comprised between the memory addresses of the first area 420' and the remaining addresses of the second area 420', the sub-area being directly accessible by instructions of the user firmware.

More particularly, according to a preferred embodiment of the present disclosure, the sub-area 420sub containing the Call instructions is allocated on the top of the second area 420", and the reference value User_ADDR_limit is the lowest address of the first area 420'. In other words, the sub-area 420sub is the portion of the second area 420" characterized by higher addresses, even if other configurations are not excluded.

According to an embodiment of the present disclosure, the RUA signal generated by the processing unit 410 prevents a direct call of an API instruction in the second area 420" by the user firmware from the first area 420'. More specifically, if an API is directly called by a user firmware instruction, the control portion 430 of the processing unit 410 captures the corresponding address PC_addr of the program counter PC and establishes that it belongs to the first area 420': as a consequence, the RUA signal is generated (e.g. the RUA signal is equal to 1), and the user is not allowed to directly call an API located in the second area 420".

Figure 5:
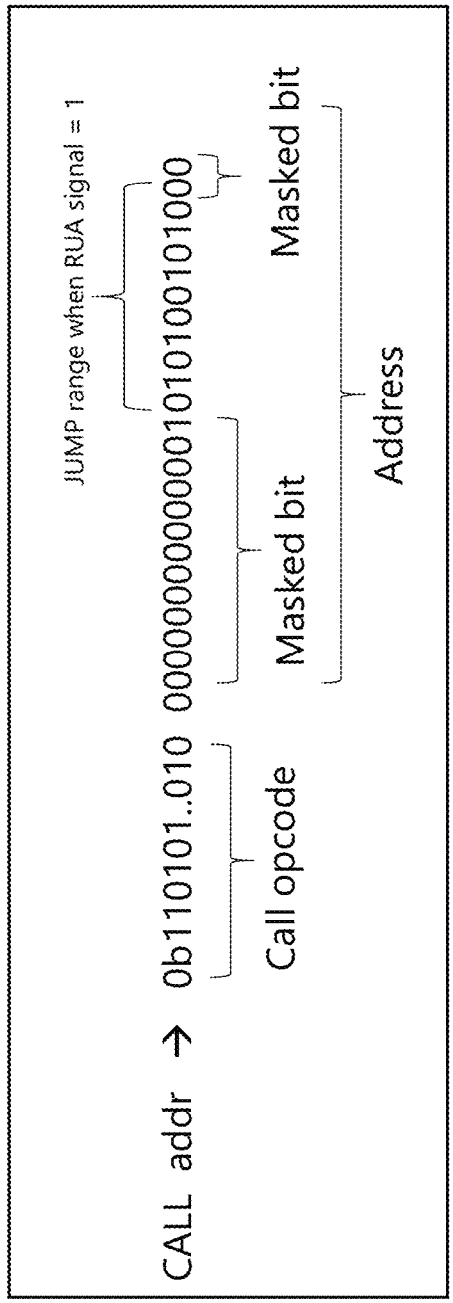
FIG. 5 is an example of an instruction filtered by the controller according to the present disclosure.

More in particular, according to an embodiment of the present disclosure, the processing unit 410 is configured to implement a first filtering block 440 which, based on the RUA signal, acts on the user program instruction. When the RUA signal is generated (e.g. the RUA signal is equal to 1), the first filtering block 440 is configured to mask parameters of the program instruction of the user firmware to prevent the direct call to the second area of the memory unit, as shown in FIG. 5, where some bits are forced to 0. For example, when the RUA signal is equal to 1, the instruction is filtered so that the destination addresses of JMPs and Calls instructions are masked to prevent a direct jump into the internal controller FLASH area and the significant digits are set to 0. The farther jump/call permitted by the controller architecture is therefore into the API look table area, i.e. into the sub-area 420sub.

Figure 6B:
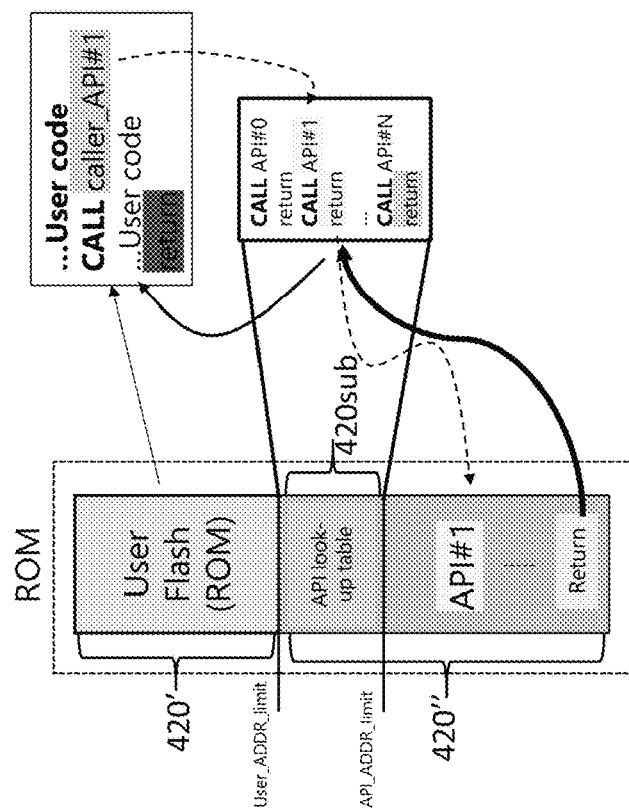
FIGS. 6A and 6B schematically show an access operation to areas of a ROM of the controller of the present disclosure.
Figure 6A:
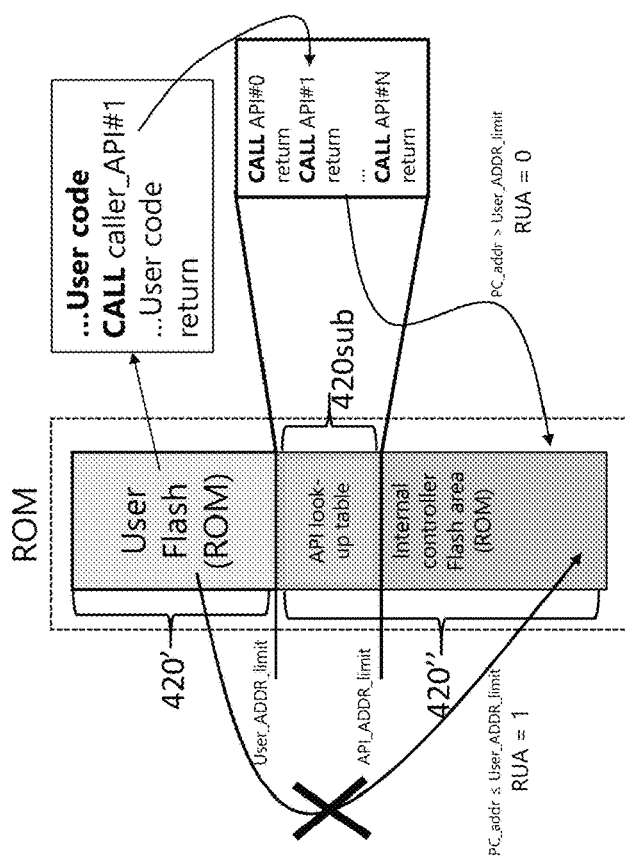

On the other hand, if the user program instruction calls a Call instruction of the API look up table in the sub-area 420sub, the control portion 430 detects that PC_addr>User_ADDR_limit and no control output signal is generated (i.e. the RUA signal is equal to 0), since the memory address is in this case an address associated with a Call instruction in the sub-area 420sub, which is a permitted area; in this way, the Call instruction called by the user firmware is able to call an API of the second area 420", which is thus executed without any restriction because it is called by an instruction in the sub-area 420sub, as shown in FIGS. 6A and 6B. FIG. 6A illustrates this general principle and FIG. 6B illustrates an example case where the first API of the plurality of APIs is called by the corresponding caller in the sub-area 420sub. When a subroutine is called by a Caller corresponding to a RUA signal equal to 0, all the actions are therefore allowed. The call (and the corresponding return) is therefore a two-step process and no direct Call is allowed.

In this way, the user can invoke the desired API of the second area 420" by means of the Call instructions in the sub-area 420sub and the associated actions can be executed.

Summing up, an API can be called by an instruction stored in the sub-area 420sub, i.e. inner the internal controller Flash Rom area, having memory addresses between the reference value User_Addr_limit and a further limit value in the second area 420", herein referred to as API_ADDR_limit. Such call instruction is first called by an instruction of the user firmware, i.e. inner the user Flash Rom area. This has the advantage that the user can write his own firmware in the first area and can interact with the controller internal firmware in the second area, while maintaining the secrecy of certain information, providing a very versatile and reliable controller.

Referring again to FIG. 4, according to an embodiment of the present disclosure, the controller 400 further comprises a Random-Access Memory (RAM) 450 comprising a first RAM area 450', which is directly accessible by the user firmware (and therefore directly accessible by an external controller such as the SoC controller), and a second RAM area 450" having different addresses. The first area 450' of the RAM is the stack pointer where data are organized in a LIFO configuration, allowing the execution of PUSH-POP instructions as known in the art. Accordingly, the user is always allowed to access to this area without any restriction. The separation RAM address between the first RAM area 450' and the second RAM area 450" is hereinafter referred to as STACK ADDR.

The second area 450" of the RAM comprises a first portion 451 that can never be accessed by the user (only the manufacturer can access to that first portion 451) and a second portion 452 that can be accessed by the user under specific circumstances.

In particular, when the processing unit 410 generates the output signal (i.e. when the RUA signal is equal to 1), a dedicated second filtering block 460 (hereinafter referred to as R_Addr_filter) prevents the selection of all the addresses of the second area 450" of the RAM, and also the second portion 451 of this area is not addressable. In this case, the user can have control only of the first area 450', i.e. the stack pointer area, by PUSH/POP instructions.

In other words, if the program instruction of the user firmware is associated with a memory address belonging to the first area 420' of the ROM, the processing unit 410 recognizes that such instruction has not the required privileges to access to the portion 452 of the RAM, so that the second filtering block 460, which receives at is input the address (indicated as ram_addr) of the portion of the RAM that the user wants to access, masks the relevant parameters of the instruction so that such portion is not addressable.

However, if the output signal is not generated (namely when the RUA signal is equal to 0), i.e. when an API of the second area 420" is called by the proper Call instruction in the sub-area 420sub (which is in turn called by the user program instruction in the first area 420'), all the restrictions are removed for that specific instruction and the user can have access to the second area 450" of the RAM, in particular to the second portion 452 of said second area of the RAM. In other words, when the RAM is addressed by an API called by its proper Caller, the constraints on the RAM address are removed.

Furthermore, according to an embodiment of the present disclosure, the controller comprises an interface with a plurality of test registers (simply indicated as T_reg), each register being associated with a specific address (indicated as T_reg_addr), for testing the functionality of the memory component to which the controller 400 is associated, or generally for interfacing the memory component with a testing machine and/or an external controller.

The test mode architecture of the memory component is therefore based on these registers, which, under certain circumstances, can be written/read by the SoC controller via JTAG interface, by the test machine via JTAG interface, and by the flash array controller 400 via internal buses.

The test registers T_reg contain the instructions (e.g. parameters such as currents/voltages) for the test of the memory component.

In particular, test registers are organized in several banks each containing N registers (N=8, 16, etc.) and being associated with a specific address (hereinafter referred to as TL_addr). Each bank is also apt to drive one or more macro function (Analog or Digital). For example, Bank 0 is devoted to Positive Read Charge Pump and each bit of the bank corresponds to a specific function (e.g. bit 0=PUMP enable, bit 5:1=clock frequency, bit 7:6=drive capability (Max current)), while Bank 12 is dedicated to Sense Amplifier.

The test of the memory component is therefore managed by a protocol based on a JTAG interface using the instructions of the test registers T_reg. As previously observed, the test can be controlled by the SoC controller or by an external test machine. In any case, both the approaches are based on a Built-In Self-Test (BIST) executed by the internal flash array controller 400 of the present disclosure. This approach also maintains secret the internal algorithm with sensitive technological parameters (such as timing voltages and the like).

In order to allow the use of some test registers and to disable the access to other reserved test registers, according to an advantageous embodiment of the present disclosure, the controller 400 comprises a third filtering block 470 (indicated also as T_Addr filter).

In fact, not all the test registers T_reg can be accessed by the external user, and the third filtering block 470 is configured to disable the access to some test registers T_reg based on the RUA signal generated by the processing unit 410. In this embodiment, the third filtering block 470 is configured in such a way that, when the RUA signal is generated by the processing unit 410, some reserved registers are not addressable by masking the specific address of such register, and the output of such third filtering block 470 yields only the first allowed register T_reg.

The test registers T_reg that are not addressable are written by the controller 400 in a configuration register.

As seen before, once the address captured from the program counter PC is inner the second area 420" of the ROM (i.e. when PC_addr>User_ADDR_limit) the RUA signal is equal to 0 and all the restrictions are removed. In other words, when a test register T_reg is accessed by an API called by a proper caller in the sub-area 420sub, such register is not forbidden and can be used by the external user (however, it cannot be used directly by the user firmware). In this way, the user can access to some register without the possibility of directly writing/erasing such registers, i.e. he has an indirect access to the registers.

In one embodiment, some registers T_reg can never be accessed by the user firmware and can be accessed only by the manufacturer, which has the required privileges to execute a specific test-mode requiring the user of such forbidden register.

According to an embodiment of the present disclosure, the processing unit 410 is also configured to receive at an input thereof a further signal that forces the control portion 430 to not generate a RUA signal (i.e. it sets RUA=0 by default). For example, this further signal, herein indicated as Force_RUA_low, is the output of one of the plurality of test registers T_reg, preferably a register that cannot be accessed by the external user (i.e. a register that can be accessed only with a high privilege test-mode, which can be performed for example only by the manufacturer). In this case, all constraints are removed.

Figure 7:
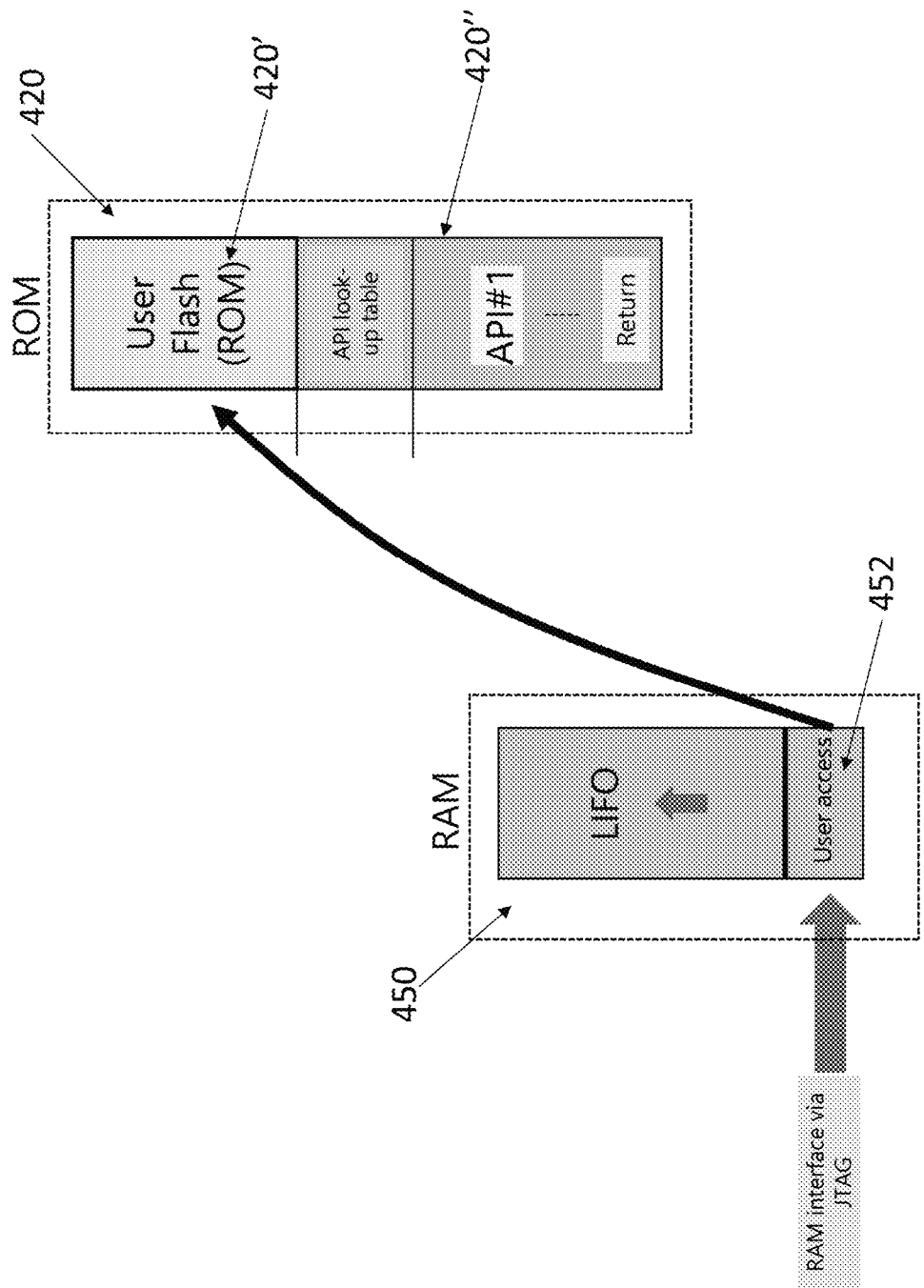
FIG. 7 schematically shows an initialization of a user area of the ROM of the controller of the present disclosure.

Finally, according to an embodiment of the present disclosure, the external controller (e.g. the controller of the SoC) is not able to direct programming the first area 420' of the ROM. The controller can then be programmed by the user through a method comprising: writing a firmware into a portion of the RAM using the JTAG protocol, in particular into the second portion 452 of the second RAM area 450", as shown in FIG. 7. The method then comprises invoking an API stored in the second area 420" the ROM, said API being specifically devoted to the user programming phase, and then moving, via this API, the firmware to the first area 420' of the ROM, where it is stored. The API devoted to User flash update then erases and programs the firmware into the flash block. The operation is possible because the two FLASHs have "well region" separated.

In conclusion, according to the present disclosure, the controller enables the user to write his own firmware in the dedicated ROM area and shares some information to perform specific operations, while secret information remains secret, since they are executed in an indirect way by means of the API lookup table and some areas of the controller can never be accessed. More in particular, thanks to the RUA signal generated by the processing unit, it is possible to implement an "Instruction Filter" configured to filter some instructions of the user program in order to avoid CALLs/JUMPs outside the permitted area. During the code execution from the user FLASH Rom area (i.e. when RUA=1) some constraints are therefore applied to code regions reachable, RAM address addressable, and T_REG and then textmodes usable. Therefore, even if the user is allowed to use some resources of the controller, it cannot directly access/write to forbidden areas of this controller.

This modified architecture ensures a great versatility of the controller of the present disclosure and permits the user to use some functionalities without directly accessing to forbidden areas.

Moreover, the filters can be configured such that different restrictions for different users having different access privileges can be applied (for example different RAM area, different constraint on T_reg and different API available). In particular, the filters of the controller can receive additional inputs accounting for the particular test-mode to be performed, each test-mode being associated to a particular user having a specific privilege, allowing the controller to apply different restrictions for different users, as above indicated. It is thus possible to perform different test-modes with different privileges, and according to such privileges, the access to some areas of the controller is forbidden.

In other words, the filtering blocks can be configured differently based on the different users, which can be recognized by the controller during authentication, such controller thus configurating the filters accordingly.

Figure 9:
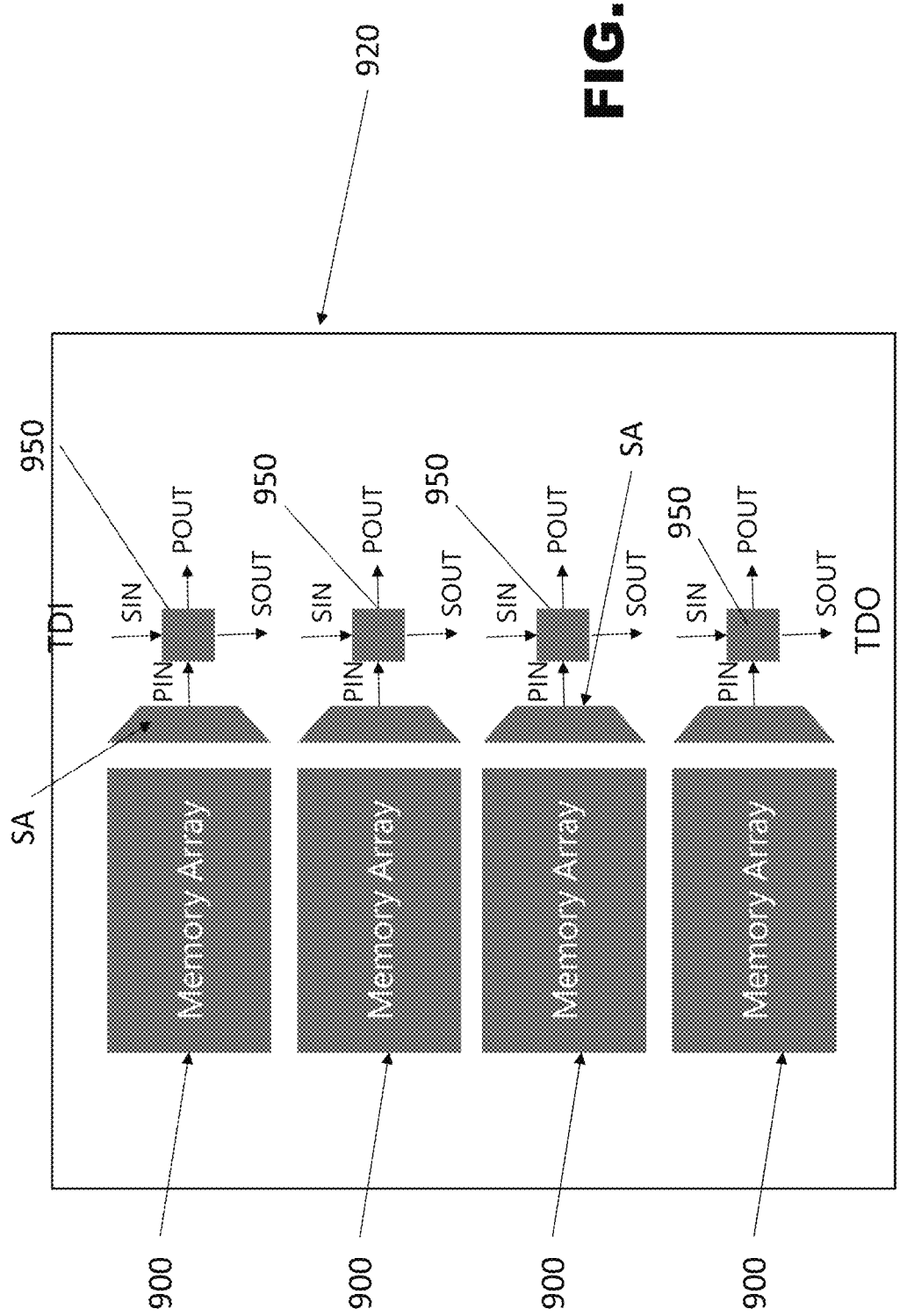
FIG. 9 is a schematic view of a particular of the memory portion shown in FIG. 2.

Coming now to a closer look to the internal structure of the memory component 210 (or 310) it should be noted that the architecture of the memory array 320 is built as a collection of sub arrays 900, as shown schematically in FIG. 9, wherein the reference 320 of FIG. 3 corresponds to the reference 920 of FIG. 9.

Each sub array 900 is independently addressable inside the memory device 310. Each sub-array 900 contains multiple memory blocks 1160 (depicted in more detail in FIG. 11).

In this manner, having smaller sectors if compared to known solutions the access time is significantly reduced and the whole throughput of the memory component is improved. The reduction of the initial latency time is at block level because the row and column lines, the read path associated latency and the external communication have been optimized. The initial latency is the time needed to have the first valid data after the issuing of the address.

In the embodiments disclosed herewith the memory array 920 is structured with a number of sub-arrays 900 corresponding to the number of cores of the associated SoC 200 and, therefore to the number of corresponding communication channels. For instance, at least four memory sub arrays 900 one for each communication channel with a corresponding core of the SoC 200 are provided.

The host device or the System-on-Chip 200 normally includes more than one core and each core is coupled to a corresponding bus or channel for receiving and transferring data to the memory component 210 or 310. We will make a generic reference to a number of K buses for N data Bits.

Therefore, in the present implementation each sub-array 900 has access to a corresponding channel to communicate with a corresponding core of the System-on-Chip 200. The outcome of the memory blocks is driven directly to the SoC without using high power output buffers and optimizing the path.

The advantage of this architecture is that it is very scalable, wherein expanding and/or reducing the density of the final device translates only in mirroring a sub-array and generating the connection or increasing the number of blocks of each subarray, that is the available density per core.

In embodiments of the present disclosure each independently addressable location of the blocks of each memory sub array 900 addresses an extended page 1150 (depicted in more detail in FIG. 11) that will be also defined hereinafter with the term super page intending a double extended page.

As non-limiting example, this extended page 1150 comprises a string including a first group of at least N Bits, for instance one-hundred-twenty-eight (128) Bit for the I/O data exchange with the SoC device 200 plus at least a second group of M Bits, for instance twenty-four (24) address Bit and a final or third group of at least R Bits, for instance sixteen (16) ECC Bit. The M address Bit (in the example the twenty-four address Bits) are sufficient to address up to 2GigaBit of available memory space.

According to the present disclosure, the outputs of the sense amplifiers SA prepare a double extended page at a time, i.e. a super-page 1150 comprising a number of Bits given by the double combination of the above-mentioned three groups of data bits, address bits and ECC bits, according to the size of the memory array.

In the specific but non-limiting example disclosed herewith each extended page 1150 includes at least 168 Bit obtained by the combination of the above three groups of N+M+R=128+24+16 data, address and ECC Bit and each super-page is formed by a couple of extended pages, i.e. a group of 168×2 Bits.

Just to give a non-limiting numeric example, each row of a memory block 1160 includes sixteen extended pages. Therefore, the resulting row includes 2688 Bit coming out from the combination of sixteen extended pages independently addressable and each including 168 Bit or, said differently, the combination of eight super-pages.

In embodiments of the present disclosure the output of a generic sub-array 900 is formed combining the following sequence: N data cells plus M address cells plus R ECC cells. In this non-limiting example the total amount of Bits would involve 168 pads per channel, as shown in the example FIG. 8.

The combined string of data cells+address cells+ECC cells allows implementing the safety coverage of the bus according to the standard requirements, because the ECC covers the whole bus communication (data cells+address cells), while the presence of the address cells provide the confidence that the data is coming exactly from the addressed location of the controller.

Figure 10B:
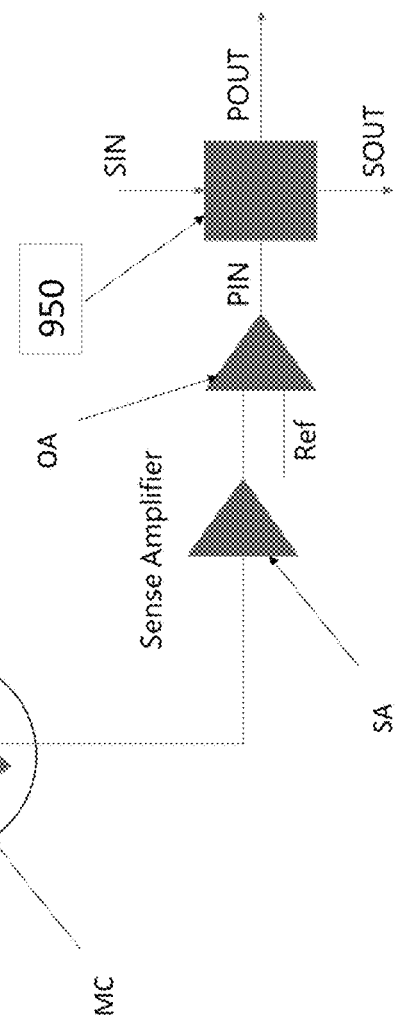
FIG. 10B is a schematic view of the connections between a generic memory cell and a corresponding sense amplifier with the inclusion of the modified JTAG cell according to the present disclosure.
Figure 10A:
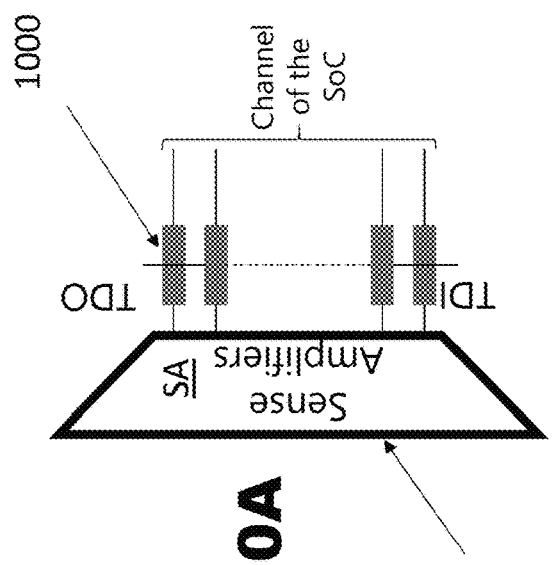
FIG. 10A is another schematic view of a particular of the memory portion shown in FIG. 2.

The sense amplifiers SA of each sub array 920 are connected with a scan-chain of modified JTAG cells 950, connecting together all the output of one sub-array 900, as shown in FIGS. 9 and 10A.

FIG. 10A shows a schematic view of a memory portion wherein the subarray 900 architecture is structured to serve at least a channel of the SoC structure 200 to which the memory component 210 is associated.

In this FIG. 10A it is shown an example wherein the modified JTAG cells 950 associated to a sub array 900 can be interconnected to form a unique scan-chain 1000 for quickly checking the integrity of the pad interconnections.

Thanks to the memory architecture of the present disclosure it is possible to pass from a parallel mode for retrieving data and addresses from the memory sub arrays 900 to a serial mode for checking the interconnections between the memory component 210 and the associated SoC device 200. Moreover, the SoC 200 is entitled to read once '1' and once '0' to perform tests and can also analyze the memory outcome, scanning out the data using the scan-chain.

It should be further noted that each subarray 900 includes address registers connected to data buffer registers, similarly to an architecture used in a DRAM memory device, i.e. DDRX type of DRAMs.

In the following paragraphs of the present disclosure it will be apparent that the outputs of the sense amplifiers SA per sub array 900 are latched by an internal circuit, so to allow to the sense amplifiers to execute a further internal read operation to prepare the second nibble or group of 128 Bits. This second nibble is transferred to the output of the flash array 320, using an additional enabling signal (i.e. an internal clock signal or an ADV signal; ADV=Address Data Valid. in our case the signal is load_data[1:0], depending on the addressed flip flop) that transfers the content read at sense amplifier level to the host device or SoC device 200.

In other words, the internal sense amplifiers prepare two extended pages 1150 and while the first page is ready to be shifted (or also shifted out), internally it is performed a reading phase of the second page associated with the same address. This allows to prepare from five to eight double word (in the present example), that are typical in the RTOS application. In any case, the disclosed structure can be expanded to allow multi-page read while shifting out the already read page.

The sense amplifiers SA are connected directly to a modified JTAG cells 950, that will be later disclosed in greater details, so to integrate a JTAG structure and the sense amplifiers in a single circuit portion. This allows reducing as much as possible the delay in propagating the output of the memory array to the SoC.

Just to report a numeric example based on the embodiment disclosed herewith, we may remark that each address in the address buffers is linked to a data buffer, containing for instance N data Bits (i.e. 128 Bits). However, the SoC can need up to 2*N Bits (i.e. 256 Bits, without the address Bits and the ECC) at a time, so the data buffers will be duplicated so to be able to shift, assuming to use the address 0 of the sub array 0:

First pass of the first group of N Bits: Data 0_0_H [127:0]
Second pass of the second group of N Bits: Data 0_0_L [127:0]

The above indications are for a are standard read used for instance for safety purpose and data integrity/correction.

In one embodiment the address buffers are realized making use of modified JTAG cells 950 as we will see hereinafter.

In one embodiment of the present disclosure each sub array 900 is independently addressable inside the memory device 210.

Figure 11:
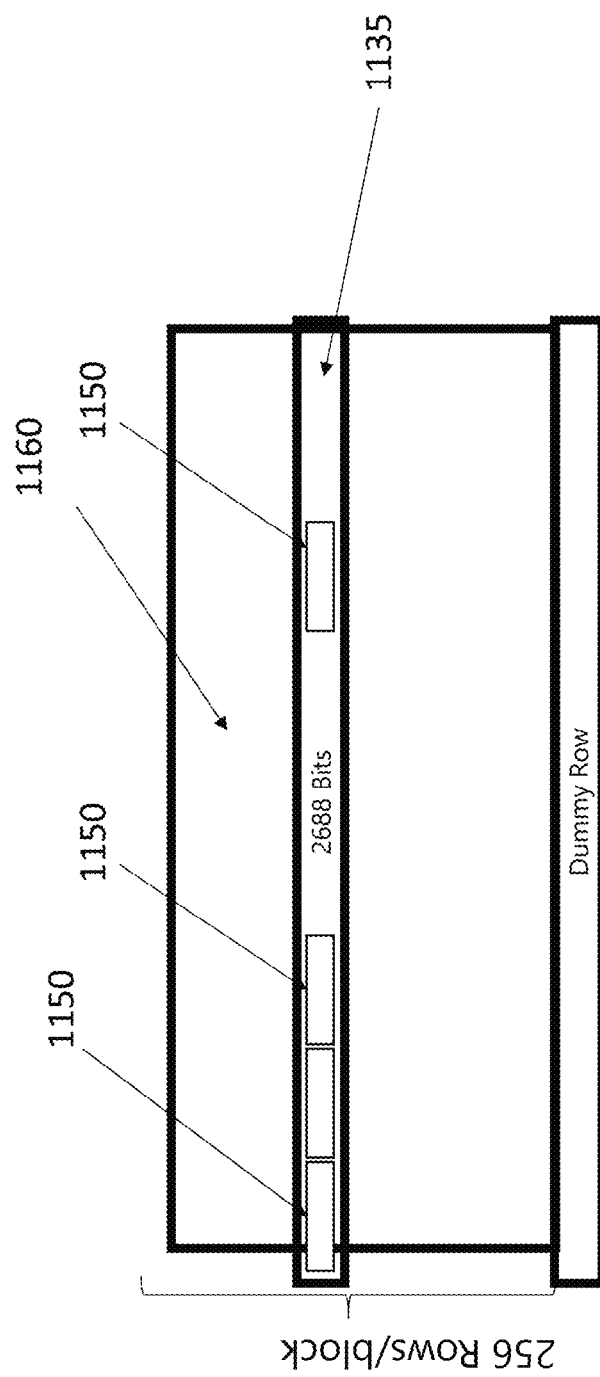
FIG. 11 is a schematic view of memory block formed by a plurality of rows of a memory array according to one embodiment of the present disclosure.

As shown in FIG. 11, each block 1160 of each memory sub array 900 is structured with a row 1135 containing at least 16 double words of N Bits (i.e. 128 bits) each, plus the M address Bits and the R ECC syndrome spare Bits per page forming a memory page of N+M+R 168 Bits. This architecture is similar to a DRAM like scheme for preparing multiple addresses at the same time. For instance, each double words including N+M+R Bits may include 168 Bits plus 168 Bits to form the super page previously mentioned.

A skilled in this art may appreciate that a larger or a smaller memory device can be structured with an increased number of memory sub arrays 900 thus expanding or reducing the density of the final memory device 210. A larger memory device is obtained for instance by mirroring a sub array 900 and providing the corresponding interconnections in a very scalable manner.

The combined string of data cells+address cells+ECC cells forming the extended or super page 1150, shown schematically in FIG. 11, allows implementing the safety coverage of the bus according to the standard requirements of the rule ISO26262, because the ECC covers the whole bus communication (data cells+address cells), while the presence of the address cells provides the confidence that the data is coming exactly from the addressed location of the controller, i.e. if ADD=ADD0.

The R ECC cells allows the host controller to understand if corruption is happening in the data plus address content.

The implementation of this mechanisms ensures the optimization of the read operation of the memory.

The JTAG Cell 950 is connected in the following manner shown in FIG. 10B:

PIN: output of a sense amplifier
POUT: to the SoC correspondent Data I/O
SIN: is the serial IN input connected to the SOUT of the previous sense amplifier
SOUT: is the serial output connected to the SIN of the next sense amplifiers The scan chain 1000 made by the interconnected JTAG cells 950, using the serial input and output, has some advantages:

be able to test the successful interconnection between the SoC and the Direct Memory Access (DMA) Memory;
be able to implement digital test of the sense amplifiers, because the cell can work as program load to store the data inside the array;
be able to work as second level of latches.

We will see later in the present disclosure that when the first group of data Bits are ready to be transferred to the parallel output POUT of the sense amplifier, there is an internal latch coupled to the sense amplifier that can trigger the read data of the subsequent section of the remaining data Bits.

Still making reference to the examples of the FIGS. 10A and 10B we may consider the interconnections of each JTAG Cell 950: PIN is coupled to the output of a sense amplifier; POUT is coupled to the corresponding Data I/O of the host device 200 (i.e. the System-on-Chip); SIN is the serial IN input connected to the SOUT of the previous sense amplifier while SOUT is the serial output connected to the SIN of the next sense amplifier.

For instance, the schematic example of FIG. 10B shows a schematic and generic memory cell MC which is located at the intersection of a row of memory cells and a column of memory cells in a matrix of cells of a generic sub-array, so that the cell can be addressed accordingly. The real implementation can contain additional circuits from the cell to the output of the SA but they are not shown not being relevant for the purpose of the present disclosure.

A sense amplifier SA is coupled to the column of memory cells as part of the read circuitry that is used when a data is read from the memory array. Generally speaking a memory word including the above-mentioned super page 1150 is read at a time and in the present example we will make reference to a memory page including data+address+ECC Bits.

As is well known, the role of the sense amplifier is that of sensing the low power signals from the array row. The low voltage values representing the logic data Bit (1 or 0, depending on conventions) stored in the memory cell MC are amplified to a recognizable logic level so the data can be properly interpreted by logic circuit portions outside the memory.

In the example disclosed herewith the output of each sense amplifier SA is coupled to the modified JTAG cell 950 so to integrate a JTAG structure and the sense amplifier.

In the non-limiting example disclosed herewith an output amplifier OA is interposed between the sense amplifier SA and the JTAG cell 950.

Thanks to the memory architecture of the present disclosure it is possible to pass from a parallel mode for retrieving data and addresses from the memory sub arrays 900 to a serial mode for checking the interconnections between the memory component 210 and the associated host device. Moreover, the SoC is entitled read once '1' and once '0' to perform tests and can also analyze the memory outcome, scanning out the data using the scan-chain The passage from the parallel to the serial mode is managed by the JTAG interface 350. However, the implementation of these dual mode operations is allowed by the specific structure of a modified JTAG cell 950 disclosed hereinafter.

Figure 12:
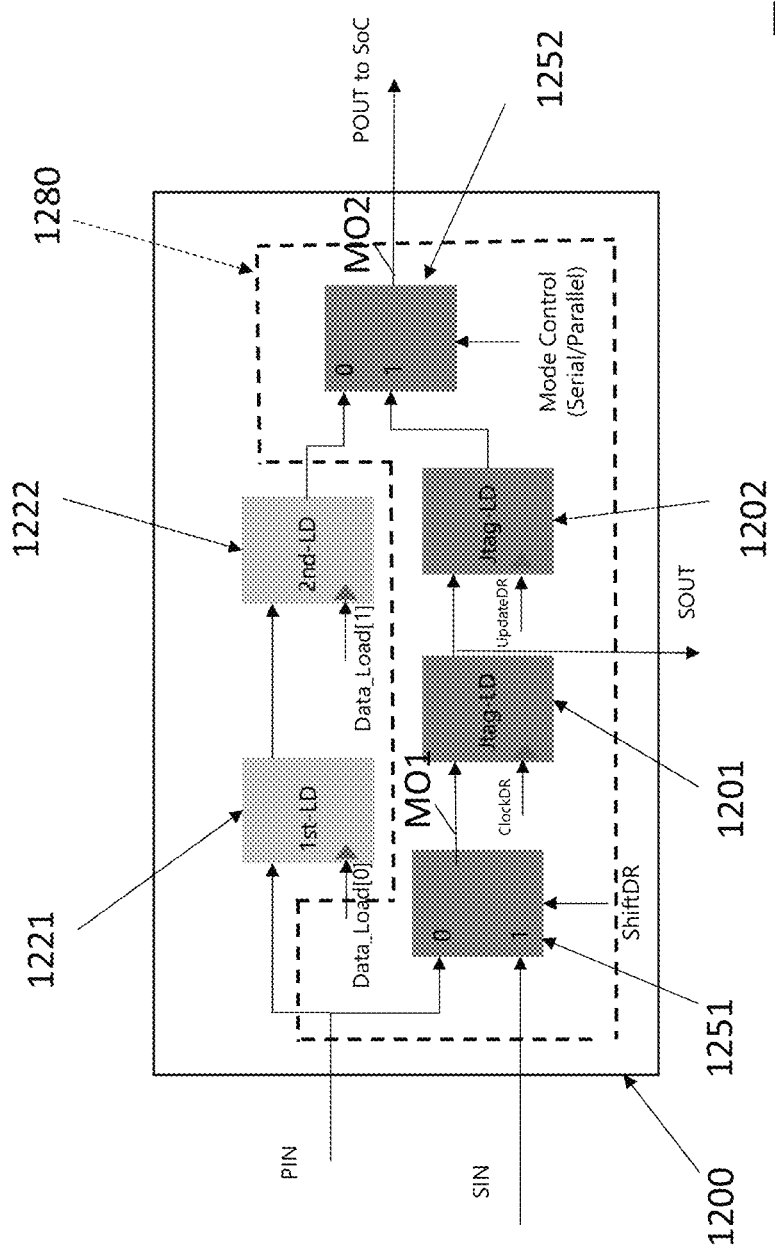
FIG. 12 is a schematic view of JTAG cell that has been modified according to the present disclosure.

Making now more specific refence to the schematic example of FIG. 12 it is shown a JTAG cell 1200 modified according to the present disclosure and corresponding to the modified JTAG cell 950 previously disclosed with reference to FIGS. 9, 10A and 10B.

The JTAG cell 1200 has a first parallel input PIN terminal and a first serial input SIN terminal receiving corresponding signals Pin and Sin. Moreover, the JTAG cell 1200 has a first parallel output terminal POUT and a first serial output terminal SOUT. The scan-chain 1000 allows outputting the whole 256 bits, because the first group is read directly from the output while the second group is prepared in the back.

As shown in FIG. 12 the JTAG cell 1200 may be considered a box with two input terminals PIN and SIN and two output terminals POUT and SOUT. The input terminal PIN is a parallel input while the input terminal SIN is a serial input. Similarly, the output terminal POUT is a parallel output while the output terminal SOUT is a serial output.

Thanks to the serial input and output a testing process may be performed to check that no fault connection is present between the memory component 210 and the associated System-on-chip 200. Thanks to the parallel input and output the same JTAG cell is used as data buffer for the completing the reading phase through the sense amplifiers SA.

The JTAG cell 1200 comprises a boundary scan basic cell 1280 including a couple of latches 1201 and 1202 and a couple of multiplexer 1251 and 1252. A first input multiplexer 1251 and a second output multiplexer 1252.

The boundary scan basic cell 1280 is indicated by the dotted line box in FIG. 12 and is a two inputs cell, with a serial input corresponding to SIN and parallel input corresponding to PIN, and two outputs cell with a serial output corresponding to SOUT and a parallel output corresponding to POUT.

The first multiplexer 1251 receives on a first input "0" a parallel input signal Pin from the first parallel input terminal PIN and on a second input "1" a serial input signal Sin from the first serial input terminal SIN.

This first multiplexer 1251 is driven by a control signal ShiftIR (referred to the instruction register signal) and has an output MO1. The cell 1200 has two parallel outputs, i.e. MO1 and MO2. When the JTAG clock arrives, the serial output is driven out from the SOUT. SOUT is connected to the JTAG latch close to the multiplexer that receives a selector signal: Mode Controller (serial/parallel). Basically, the output of the latch connected to the input '1' of this multiplexer MO2 is also the SOUT.

The first multiplexer output MO1 is connected to a first input of the first latch 1201 that receives on a second input terminal a clock signal ClockDR.

The first latch 1201 is connected in chain to the second latch 1202 with a first output of the first latch 1201 connected to a first input of the second latch 1202.

It is important to note that the output of the first latch 1201 is also the serial output SOUT of the whole JTAG cell 1200.

A second input terminal of the second latch 1202 received a signal UpdateDR.

The second latch 1202 has an output connected to an input of the second multiplexer 1252, in particular to its second input.

This second multiplexer 1252 is controlled by a Mode Control signal that allows to switch the whole JTAG cell 1200 from a serial to a parallel mode and viceversa.

In one embodiment of the present disclosure the JTAG cell 1200 further includes another couple of latches 1221 and 1222 provided between the parallel input Pin and the second multiplexer 1252. These extra latches 1221 and 1222 are the latching of the direct read, i.e. first group of data Bits, and the shadow one, i.e. second group of 128 data Bits (without considering the address Bits and the ECC). In other words, the JTAG cell 1200 includes the boundary scan cell 1280 and at least the further latches 1221 and 1222.

We will refer hereinafter to these further latches as a third latch 1221 and a fourth latch 1222. In other embodiments a longer chain of latches may be used.

More particularly, the third latch 1221 and the fourth latch 1222 are connected in a small pipeline configuration with the third latch 1221 receiving on a first input the parallel input signal Pin from the first parallel input terminal PIN and receiving on a second input a signal Data_Load[0] corresponding to the AVD signal previously mentioned and to a first data load.

The fourth latch 1222 receives on a first input the output of the third latch 1221 and receives on a second input a signal Data_Load[1] (always the AVD signal)corresponding to a subsequent data load.

The output of the fourth latch 1222 is connected to the first input "0" of the second multiplexer 1252 that produces on its output terminal MO2 the output signal for the parallel output terminal POUT.

If compared to a conventional JTAG cell the JTAG cell 1200 of the present disclosure may be considered a modified JTAG cell because of the presence of the two extra latches, the third and fourth latches 1221 and 1222, beside the presence of the boundary scan cell 1280.

Now, we have to imagine that a JTAG cell 1200 is coupled to the output of each sense amplifier SA of the memory sub-array 900. As usual, the memory array provides for a sense amplifier for each column of memory cells, as shown in FIG. 10B.

In the embodiment of the present disclosure all the JTAG cells 1200 coupled to the sense amplifiers of a memory sub-array are to be considered a data buffer including a data page, including in this example at least one-hundred-and-twenty-eight (128) Bits (always without the address Bits and the ECC Bits) for the reading of a combined memory page at a time from the four sub arrays 900.

However, as previously reported, the communication channel between the memory component and the SoC structure may need up to 256 Bits at a time (i.e. two combined memory pages) but in the present disclosure other 2×16 plus 2×24 further Bits are needed. The JTAG cell 1200 has been modified just to duplicate the internal latches to be able to shift the first or higher portion of the 128 Bits of the data to be read with the second or lower portion of the data to be read. Obviously, in this contest "higher" means the data portion that is loaded before while "lower" means the data portion that is loaded after.

A skilled in this art will understand that the number of internal latches of the modified JTAG cell 1200 can be augmented in case of need to improve the number of Bits to be transferred to the SoC structure through the communication channel. For example, the above structure may be expanded accordingly to the size of the page required by the particular implementation of the memory controller.

Just to explain the manner in which data are transferred in the data buffer we have to imagine that when a data is loaded in the one of the two latches 1221 or 1222, the other latch is in a stand-by state but ready to receive the subsequent data portion.

Therefore, the first section including 128 Bit (without considering the address Bits and the ECC Bits) is transferred to the SoC structure for a first data elaboration while the reading phase is not stopped since the other portion of 128 Bits are prepared to be loaded into the latches at the subsequent clock signal.

In this example, each data buffers contains 128 modified JTAG cells 1200 and the common Data_Load[1:0] are signals generated to allow to capture the whole 256 Bits, that is to say: eight double words DWs according to the proposed implementation (four sub arrays for each double word).

The signal generation is internally controlled when the read operation is performed in a specific data buffer and the signals are controlled by the SoC structure to allow performing read phase using a 128 Bits parallelism.

The main benefit of this memory architecture is that each buffer can contain the whole double words DWs thus leaving free the sense amplifier to read in another memory location.

The presence of the modified JTAG cell 1200 is particular important as output of the sense amplifiers since allows:

a. Using the boundary scan as method to check the interconnection between the SoC 200 and the Flash Array component 210 or 310;
b. Implement the Direct Memory Access connecting directly the sense amplifier with the controller;
c. It allows to leave the sense amplifier to prepare the second 256 bit wide page plus the address plus the ECC and written close to the page.

Figure 13:
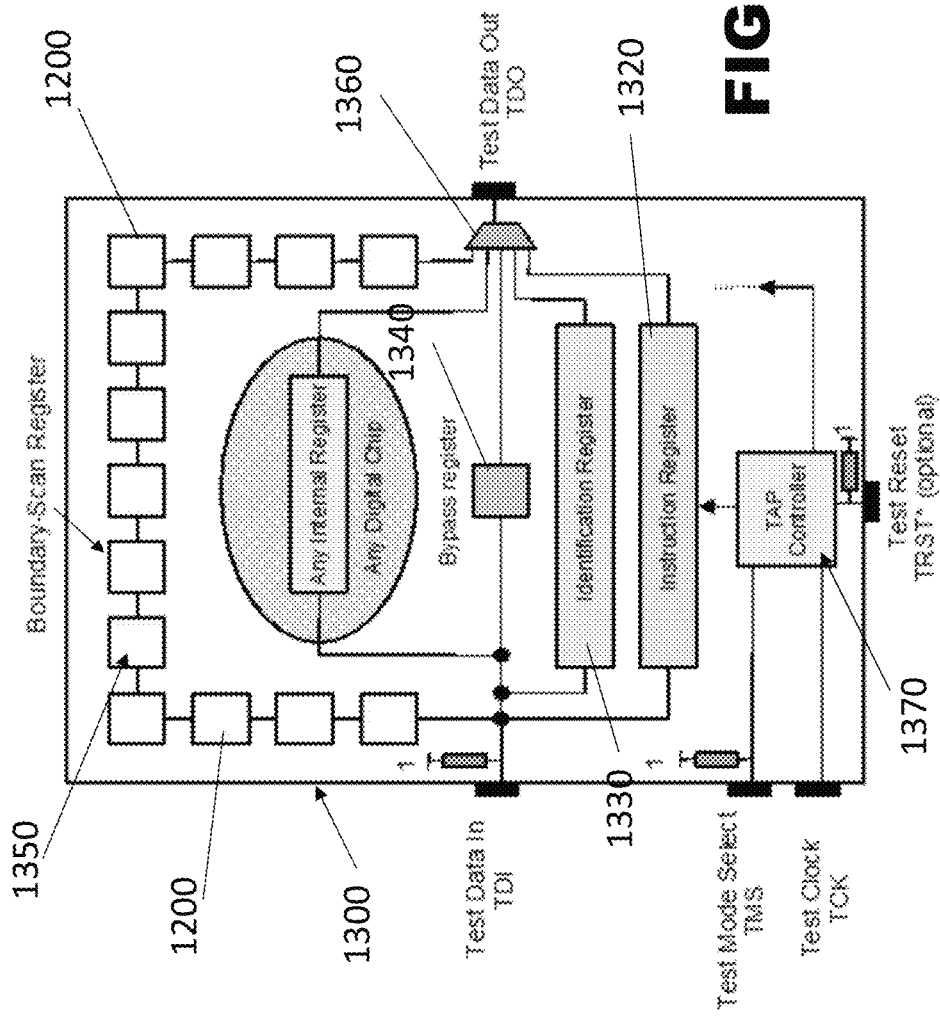
FIG. 13 shows a schematic view of a standard structure architecture using boundary-scan cell configured according to the IEEE standard No. 1149.1 but including the modified JTAG cells of FIG. 10B.

Another advantage is given by the possibility to adopt a boundary-scan test architecture including modified JTAG cells 1200 thus obtaining a new and peculiar boundary-scan test architecture like the one shown in the schematic view of FIG. 13. This is a further advantage since for this test only one output driven is needed and this is obtained using the signal TCK and the data stored in the cells. The scan chain test requires the SoC 200 to test the output of the scan chain.

As it is known in this specific technical field, boundary scan is a family of test methodologies aiming at resolving many test problems: from chip level to system level, from logic cores to interconnects between cores, and from digital circuits to analog or mixed-mode circuits.

The boundary-scan test architecture 1300 provides a means to test interconnections between the integrated circuits 210 and 200 on a board without using physical test probes. It adds a boundary-scan cell 1200, like the one shown in FIG. 12, including a multiplexer and latches and associated to each pin or pad on the device.

In other words, each primary input signal and primary output signal of a complex semiconductor device like the memory component 210 or the host device 200 is supplemented with a multi-purpose memory element called a boundary-scan cell that, altogether, form a serial shift register 1350 around the boundary of the device.

Originally, those boundary-scan cells have been introduced as a means of applying tests to individual semiconductor devices. The use of boundary-scan cells to test the presence, orientation, and bonding of devices in place on a circuit board was the original motivation for inclusion in a semiconductor device.

According to the present disclosure the boundary-scan cells 1200 are also used to test the interconnections between integrated circuits that work together such as the System-on-Chip 200 with the associated memory component 210, as is the case of the present disclosure.

The collection of boundary-scan cells is configured into a parallel-in or parallel-out shift register and the boundary-scan path is independent of the function of the hosting device. The required digital logic is contained inside the boundary-scan register. Obviously, an external JTAG FSM interacts with the cells, i.e. shiftDR, shiftIR, UpdateDR, etc. are driven by the JTAG logic 350.

To summarize very briefly the functioning of a boundary-scan cell it may be said that each cell 1200 is structured for capturing data on its parallel input PI; updating data onto its parallel output PO; serially scanning data from its serial output SO to its neighbor's serial input SI. Moreover, each cell behaves transparently, in the sense that PI passes to PO.

FIG. 13 shows a schematic view of a standard structure architecture using boundary-scan cells configured according to the IEEE standard No. 1149.1. However, according to the present disclosure, the boundary-scan cells used in the architecture 1300 are the modified JTAG cells 1200 previously disclosed with reference to FIG. 12.

A JTAG interface is a special interface added to a chip. According to present embodiments, two, four, or five pins are added allowing to expand the JTAG according to the need of the present implementation.

The connector pins are: TDI (Test Data In); TDO (Test Data Out); TCK (Test Clock); TMS (Test Mode Select) and an optional TRST (Test Reset).

The TRST pin is an optional active-low reset to the test logic, usually asynchronous, but sometimes synchronous, depending on the chip. If the pin is not available, the test logic can be reset by switching to the reset state synchronously, using TCK and TMS. Note that resetting test logic doesn't necessarily imply resetting anything else. There are generally some processor-specific JTAG operations which can reset all or part of the chip being debugged.

Since only one data line is available, the protocol is serial. The clock input is at the TCK pin. One bit of data is transferred in from TDI, and out to TDO at each TCK rising clock edge. Different instructions can be loaded. Instructions for typical ICs might read the chip ID, sample input pins, drive (or float) output pins, manipulate chip functions, or bypass (pipe TDI to TDO to logically shorten chains of multiple chips).

As with any clocked signal, data presented to TDI must be valid for some chip-specific Setup time before and Hold time after the relevant (here, rising) clock edge. TDO data is valid for some chip-specific time after the falling edge of TCK.

FIG. 6 shows a set of four dedicated test pins—Test Data In (TDI), Test Mode Select (TMS), Test Clock (TCK), Test Data Out (TDO)—and one optional test pin Test Reset (TRST).

These pins are collectively referred as a Test Access Port (TAP). However, the architecture 1300 includes a finite-state machine, named TAP controller 1370, with receives as inputs three signals: TCK, TMS, and TRST. The TAP controller 1370 is a 16-state final state machine FSM that controls each step of the operations of boundary scan architecture 1300. Each instruction to be carried out by the boundary scan architecture 1300 is stored in the Instruction Register 1320.

FIG. 13 shows a plurality of boundary-scan cells 1200 on the device primary input and primary output pins. The cells 1200 are connected internally to form a serial boundary-scan register 1350. In other words, the modified JTAG cells 1200 are used as building blocks of the boundary scan architecture 1300.

Data can also be shifted around the boundary-scan shift register 1350 in serial mode, starting from a dedicated device input pin called "Test Data In" (TDI) and terminating at a dedicated device output pin called "Test Data Out" (TDO) at the output of a multiplexer 1360.

The test clock, TCK, is TCK is selectively sent to each register depending on the TAP state and to the register selection; the fed of the TCK signal is performed via a dedicated device input pin and the mode of operation is controlled by a dedicated "Test Mode Select" (TMS) serial control signal.

The Instruction Register (IR) 1320 includes n-bit (with n≥2) and is implemented for holding each current instruction but can be expanded to handle the flexible TDI.

In line with the IEEE 1149 standard the architecture is completed by a 1-bit bypass register 1340 (Bypass); an optional 32-bit Identification Register 1330 (Ident), capable of being loaded with a permanent device identification code.

At any time, only one register can be connected from TDI to TDO (e.g., IR, Bypass, Boundary-scan, Ident, or even some appropriate register internal to the core logic). The selected register is identified by the decoded output of the IR. Certain instructions are mandatory, such as Extest (boundary-scan register selected), whereas others are optional, such as the Idcode instruction (Ident register selected).

A parallel load operation is called a "capture" operation and the data are captured in the selected register cells by the instruction. The capture causes signal values on device input pins to be loaded into input cells and signal values passing from the core logic to device output pins to be loaded into output cells.

A parallel unload operation is called an "update" operation to freeze the register content. Basically, it latches the content in the executable shadow register, inside the BS cell. This update allows to make available the shift register for future data/instruction coming in. Moreover, a PAUSE instruction permits to hold the data in the register even if it is not completed.

Depending on the nature of the input scan cells, signal values already present in the input scan cells will be passed into the core logic.

Now, in one embodiment of the present disclosure the boundary-scan architecture 1300 is completed with a further or more than one additional register 1380 that is specifically provided to manage the memory component 210. This additional register 1380 is also definable by the user. This expansion is allowed by the IEEE 1532 standard.

Figure 14:
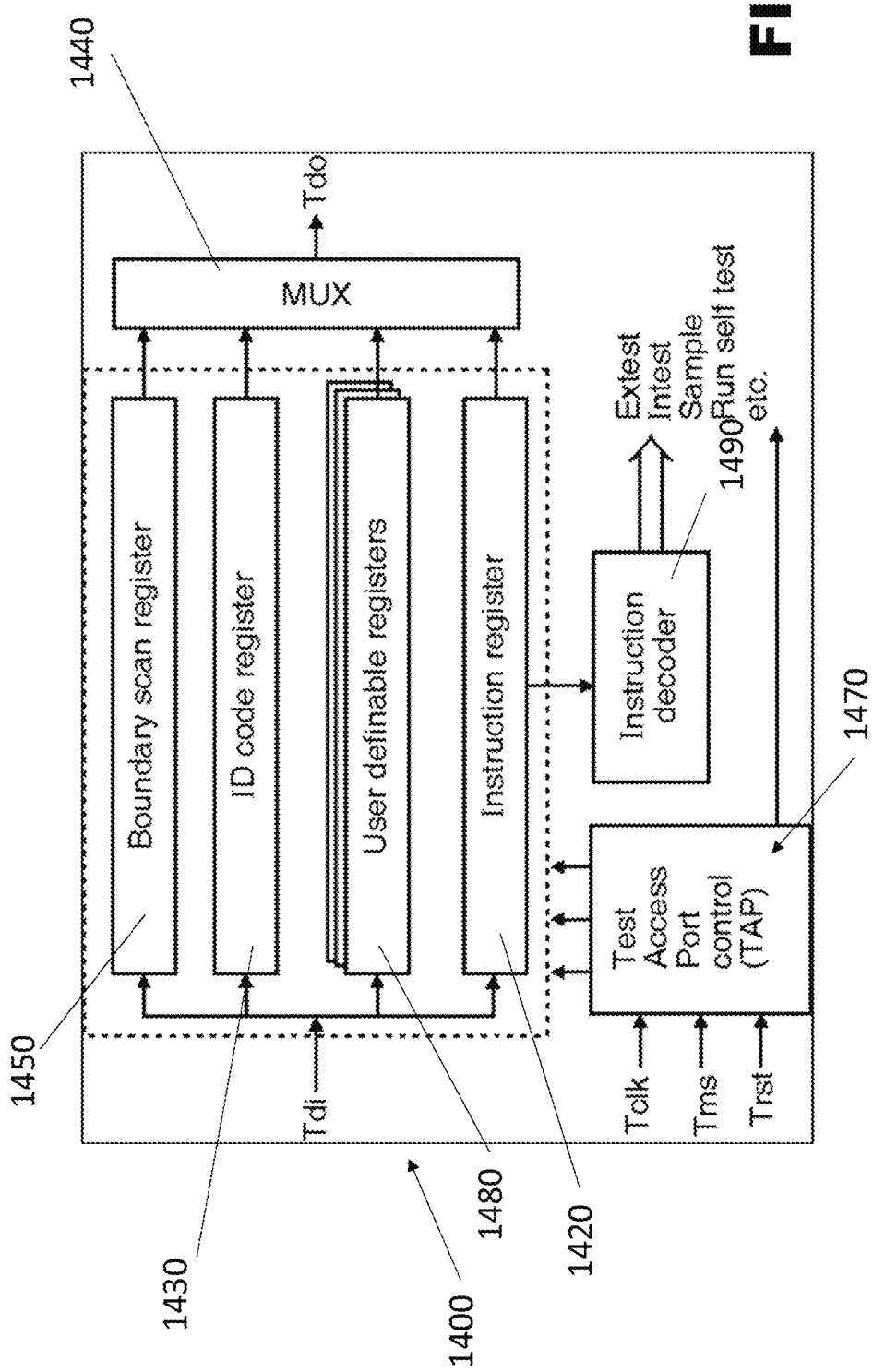
FIG. 14 is a diagram showing schematically in greater details the composition of registers incorporated into a boundary-scan architecture of the present disclosure.

FIG. 14 shows in greater details the composition of the registers incorporated into the boundary-scan architecture 1300 of the present disclosure. In this FIG. 14 the boundary-scan shift register 1450 is coupled to the TDI pin in serial mode and provides an output toward the TDO output pin via the multiplexer 1460.

The test clock, TCK, is fed in via yet another dedicated device input pin and the mode of operation is controlled by a dedicated "Test Mode Select" (TMS) serial control signal both applied to the TAP controller 1470.

The various control signals associated with the instruction are then provided by a decoder 1490.

The Instruction Register (IR) 1420 includes n-bit (with n≥2) and is implemented for holding each current instruction. The architecture includes a 1-bit bypass register (not shown in FIG. 14) and the Identification Register 1430.

The additional register 1480 is used as shift data register for allowing the interaction with the core of the host device in the writing and/or reading phases of the memory component. The user definable register can even be different. Depending on the command loaded in the IR, different register can be combined. For instance, to program the memory, it is necessary at least a data register with a size corresponding to the minimum page to be programmed in the memory array, a data address that contains which address can be loaded, optionally it may be necessary also a mask register to avoid to touch a portion of the data.

Now, the command user interface represented by the TAP controller 1470 or 1470 is based on the IEEE1149, that implement a low signal count interface, i.e. TMS, TCK, TDI, TDO, TRST (Optional) with capability to modify the internal content of the associated memory sub array 900.

Figure 15:
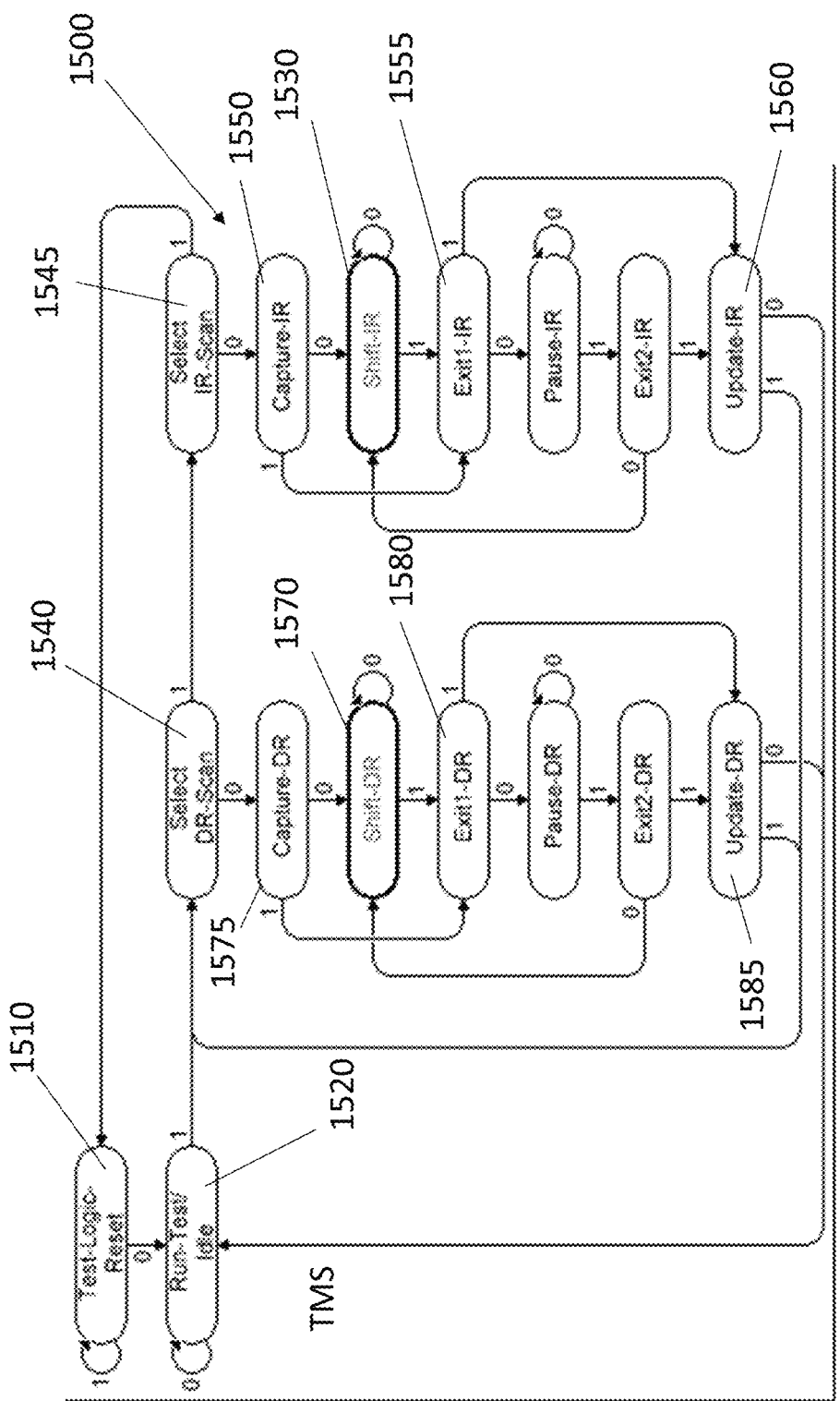
FIG. 15 shows a diagram reporting the operations of a Finite State Machine based on the JTAG protocol.

FIG. 15 shows a block diagram reporting the operations of a Finite State Machine based on the JTAG protocol.

As shown in FIG. 15, the standard IEEE1149.1 is based on a TAP finite state machine that includes sixteen states, and two of them, i.e. shift instruction register (ShiftIR) and shift data register (ShiftDR), allows the interaction with the system in write and/or read.

FIG. 15 shows schematically the Test Access Port TAP 800 as a Finite State Machine taking care of all the operations concerning the testing of an integrated circuit such as a memory device.

The sequence of logic signals "0" and "1" applied to the TMS pin controls the operation of the chip architecture through the boundary scan structure.

Let's first consider to start from the test logic reset state indicated with the number 1510 when the circuit is powered up. In this specific state all the boundary scan cells are in a so-called transparent condition with the parallel input PIN connected internally to the parallel output POUT and all the input pins are connected to the core of the integrated circuit.

By driving an appropriate sequence of logic values "1" and "0" as TMS signal it is possible to set the output multiplexer in such a manner that the TDI input is shifted as the first instruction to obtain the output TDO. The TMS signal should drive the TAP FSM in state ShiftDR or ShiftIR to connect the TDI and the TDO to a register. The code "IR" defines which register is addressed when the shiftDR state is reached.

To shift an instruction we need to go to the state ShiftIR with number 1530 and to reach that state we need to apply the following sequence: setting 0 as TMS and driving one clock pulse to TCK we reach the Run/Idle state 1520.

Selecting now a "1" from the state 1520 we pass to a selection of a Data Register scan 1540 and to an Instruction Register scan 1545. With a further "0" on the TMS we can reach the Capture phase of the Instruction Register 1550.

The capture phase allows catching to two final Bits of the Instruction Register 1420 in FIG. 14; as said the capture operation uses the parallel input.

A further "0" drives to the Shift IR that allows to pass the input value TDI to the output TDO; the TDI value at the input appears after a number of clocks equal to register size.

Keeping the TMS to "0" we may remain in the Shift IR state 1530 allowing to shift the bits received on the TDI pin to the output TDO.

It is possible to remain in that state 1530 for all the clock cycle needed to shift all the input bits.

We remain in the ShiftIR state 1530 for a number of clock cycle corresponding to the number of bits of the IR 1420 minus one. At the end of the sequence the Exit-1 IR state 1555 is reached.

From this exit state 1555 we will move to an update state 1560 driving a "1" TMS and this is the moment when the new instruction become valid. The boundary scan cells are reverted to test mode wherein the input pins are isolated from the core circuitry.

It is now possible to send the test vector to the core circuitry by reaching the Shift DR state 1570.

The states of the Data Register are similar to the states of the Instruction Registers.

Therefore, with the sequence 1-0-0 we can reach the ShiftDR state 1570.

Passing through the Capture DR 1575 the first multiplexer MO1 of the boundary scan cell is connected to the parallel input PIN and all the input pins of the boundary scan register have captured their input value.

Going now to the Shift DR 1570 the multiplexer changes its state allowing to catch the serial input SIN and the scan path is shifted from the TDI input through the boundary scan register to the output pin TDO.

The circuit remains in this state for a number of clock cycle corresponding to the number of boundary scan cells minus one; obviously, the boundary scan is one of the possible data register selected with a proper instruction in the IR register.

The new test vector comes out to the output pins when the Exit-1 DR 1580 state is passed and the Update DR state 1585 is reached.

The sequence is repeated going from update to capture to allow a new test vector to be introduced into the circuitry.

As we have seen, the TAP includes test data input and test data output and a clock signal. More particularly, the shift data register ShiftDR reports a state where the TDI is connected with a register. In that state the register content is transferred in and/or out of the device.

Similarly, the shift instruction register ShiftIR also reports a state where the TDI is connected with a register. Instruction are loaded in that state.

Due to the requirement of having multiple core inside the host device 200, the internal register 1480 of the JTAG interface must be able to support up to address and data registers. In particular, the generation of four address registers (one from each sub-array 900) is provided to be filled with a different address for each sub array 900 and triggering four different data out for the read register [0:3], per sub-array section. As an example, four address registers are provided for each sub array and also four data registers are provided for each sub array. Therefore, for instance, four sub arrays will need sixteen address registers and 16 sixteen registers.

The communication to the SoC happens connecting the selected Read Register, i.e. the output named POUT [127:0] (without considering the address Bits and the ECC Bits), directly to input of the channel of the host device or SoC 200.

This mechanism allows to pre-load the data for the controller, reducing the latency time to a very low value.

For completeness sake, it should be noted that the JTAG state machine can be used to reset a register, to access an instruction register, or to access the data selected by the instruction register.

JTAG platforms often add signals to the handful defined by the IEEE 1149.1 specification. A System Reset (SRST) signal is quite common, letting debuggers reset the whole system, not just the parts with JTAG support. Sometimes there are event signals used to trigger activity by the host or by the device being monitored through JTAG; or, perhaps, additional control lines.

In JTAG, devices expose one or more test access ports (TAPs).

To use JTAG, a host is connected to the target's JTAG signals (TMS, TCK, TDI, TDO, etc.) through a direct connection with the SoC, which may need to handle issues like level shifting and galvanic isolation. The adapter connects to the host using some interface such as USB, PCI, Ethernet, and so forth. However, according to the present disclosure the SoC is able to drive the JTAG TAP in the memory also without external aid.

The host device 200 communicates with the TAPs by manipulating the signals TMS and TCK (or also TRST if present). The signal TDI is used only to load register data reading then the results through TDO (which is the only standard host-side input). TMS/TDI/TCK output transitions create the basic JTAG communication primitive on which higher layer protocols build:

State switching: wherein all TAPs are in the same state, and that state changes on TCK transitions. All the TAP FSM are moving accordingly because the TMS is connected at the same time to all the JTAG compliant devices, fi they are present in the board.

As shown in FIG. 15, this JTAG state machine is part of the JTAG specification and includes sixteen states. There are six "stable states" where keeping TMS stable prevents the state from changing. In all other states, TCK always changes that state. In addition, asserting the signal TRST forces entry, thus bringing to the default value all the content of the registers. Their content is not anymore valid and it should be reloaded to one of those stable states (Test Logic Reset) in a slightly quicker way than the alternative of holding TMS high and cycling TCK five times.

Shifting phase (i.e. reading the captured values, while the new ones are coming in; the TDO will provide the captured values outside): wherein most parts of the JTAG state machine support two stable states used to transfer data. Each TAP has an instruction register (IR) and a data register (DR). The size of those registers varies between TAPs, and those registers are combined through TDI and TDO to form a large shift register. (The size of the DR is a function of the value in that TAP's current IR, and possibly of the value specified by a SCAN_N instruction.)

Usually there is an optional register to define the size of the data registers. The IR is checked using the standard since the low significant bits are loaded with 1 and 0. This allows to count the number of JTAG devices in the network and having knowledge of the size of each TAP IR, that can be different.

There are three operations defined on that shift register:

Capturing a temporary value.

Entry to the Shift_IR stable state goes via the Capture_IR state, loading the shift register with a partially fixed value (not the current instruction) Entry to the Shift_DR stable state goes via the Capture DR state, loading the value of the Data Register specified by the TAP's current IR.

Shifting that value bit-by-bit, in either the Shift_IR or Shift_DR stable state; TCK transitions shift the shift register one bit, from TDI towards TDO, exactly like a SPI mode 1 data transfer through a daisy chain of devices (with TMS=0 acting like the chip select signal, TDI as MOSI, etc.).

Updating IR or DR (i.e. freezing the content shifted in the selected register) from the temporary value shifted in, on transition through the Update_IR or Update_DR state. The PAUSE state is also relevant as part of the standard in each side of the shift branch.

Note that it is not possible to capture the content of a register (i.e. to latch the content of the signals connected to the register into the register cells) without writing (updating) it, and vice versa. A common idiom adds flag bits to say whether the update should have side effects, or whether the hardware is ready to execute such side effects.

Running state: wherein one stable state is called Run_Test/Idle. The distinction is TAP-specific. Clocking TCK in the Idle state has no particular side effect, but clocking it in the Run_Test state may change system state. For example, some cores support a debugging mode where TCK cycles in the Run_Test state drive the instruction pipeline.

So, at a basic level, using JTAG involves reading and writing instructions and their associated data registers; and sometimes involves running a number of test cycles. Behind those registers is hardware that is not specified by JTAG, and which has its own states that is affected by JTAG activities.

JTAG Finite State Machine is triggered at the rising edge of the TCK, the clock signal and provides output at the falling edge. This allows to use the bypass register and not losing clock cycles in the scan-chain.

The TMS signal is checked and its value triggers the state transition.

The ShiftDR and ShiftIR state are addressing I/O registers and the TDI signal is used to serial insert data inside the selected register The IR Register is used to select the specific data register and/or the instruction to be used.

When the state machine is in run-test/idle, the IR register is checked for a command and it is executed, using the data of eventual service registers, i.e. a program command can use the data register and the address register to decide what and where the data must be stored.

JTAG boundary scan technology provides access to many logic signals of a complex integrated circuit, including the device pins. The signals are represented in the boundary scan register (BSR) accessible via the TAP. This fact permits testing as well as controlling the states of the signals for testing and debugging. Therefore, both software and hardware (manufacturing) faults may be located and an operating device may be monitored.

The present disclosure obtains many advantages reported hereinafter not in order of importance. The solution previously disclosed reduces the cost of the silicon for the memory component and improve the overall quality and reliability issues for the whole apparatus including the host device and memory component.

The apparatus of the present disclosure offers a good option for realizing Real Time Operative Systems (RTOS), especially in the Automotive segment, providing a low initial latency in the first access of the memory component.

Moreover, the memory architecture previously disclosed provides for a very high quality and an error rate in the range of less than 1 part per million.

Finally, the disclosed architecture allows adopting an aggressive lithography node in the host device and the latest flash memory technology in the memory component decoupling both technologies allowing to realize the best integrated circuit for both devices in place.

Figure 16:
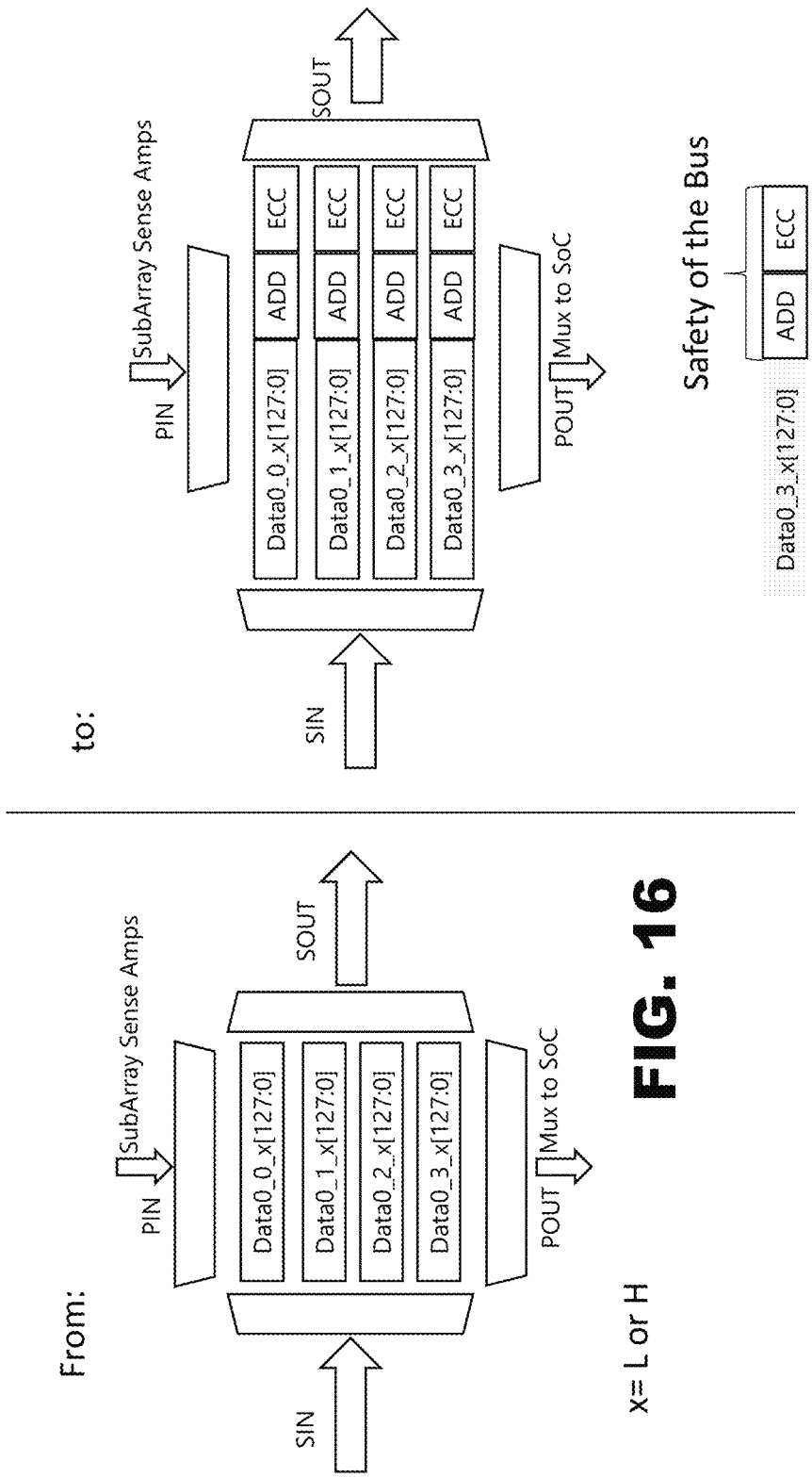
FIG. 16 shows a schematic view of the content of an output buffer for the memory block architecture of the present disclosure.

As previously disclosed, and to summarize the principle of the present disclosure, in some embodiments of the present disclosure the output of a generic sub-array 900 is formed combining the following sequence: data cells plus address cells plus ECC cells. In this non-limiting example the total amount of Bits would involve 168 pads per channel, as shown for instance in FIG. 16.

The combined string of data cells+address cells+ECC cells allows implementing the safety coverage of the bus according to the standard requirements, because the ECC covers the whole bus communication (data cells+address cells), while the presence of the address cells provide the confidence that the data is coming exactly from the addressed location of the controller.

The sense amplifiers SA of each sub array 900 are connected with the scan-chain of the modified JTAG cells 1200, connecting together all the output of one sub-array 900. Moreover, the modified JTAG cells 1200 associated to a sub array 900 can be interconnected to form a unique chain for quickly checking the integrity of the pads interconnections.

Thanks to the memory architecture of the present disclosure it is possible to pass from a parallel mode for retrieving data and addresses from the memory sub arrays 900 to a serial mode for checking the interconnections between the memory component 1 and the associated SoC device 200. Moreover, the SoC is entitled to read once '1' and once '0' to perform tests and can also analyze the memory outcome, scanning out the data using the scan-chain.

It should be further noted that each subarray 900 includes address registers connected to data buffer registers, similarly to an architecture used in a DRAM memory device, i.e. DDRX type of DRAMs.

The error correction is left, as operation, to the SoC 200; the additional bits are provided to the controller to store any possible ECC syndrome associated with the page. The ECC cells allows the SoC controller to understand if corruption is happening in the data plus address content.

To write and erase the memory cells of the Array 320 it is provided a dedicated logic circuit portion including a simplified Reduced Instruction Set Computer (RISC) controller or a Modify Finite State Machine or that is the logic circuit for handling the programming and erasing algorithms.

In one embodiment of the present disclosure, the memory component 210 implements a Direct Memory Access type of memory to replace the embedded memory array of known SoC devices.

Moreover, a JTAG interface 350 is adopted as regular user interface to modify the array and provide the read addresses to the memory blocks. The JTAG interface 350 is used also for the test of the memory component 210, allowing the re-use of the testing tooling. Therefore, the memory component 210 (or 310) also comprises a JTAG logic.

The memory component 210 uses high speed interconnection pads and the logic circuit portion to allow the interconnection with the SoC structure 200.

The final configuration will be a face-to-face interconnection SoC/Flash Array, wherein the sense amplifiers SA of the memory component 210 will be connected to the SoC in a Direct Memory Access configuration.

The Direct Memory Access allows to reduce the final latency that the SoC can experience when reading the data. Moreover, the final latency is also reduced by the block form factor, the sense amplifiers distribution between blocks, the selection of the comparison threshold in the sense amplifiers and the optimized path.

The interconnections also include the JTAG interface 210 and control pins for testing and other purposes. The core of the SoC device can have access to the JTAG interface 210 by using some internal pads 270. Such pads are high speed and have the capability to support the maximum frequency. More specifically, high speed pads 250 are used in the fast read path versus the SoC, while a low speed path is dedicated to the testing phase. The JTAG cells are part of the fast path, but the JTAG interface is using the slower path.

According to the present disclosure, the memory component 1 is equipped with a controller 230 of the flash array 90 (hereinafter referred to as Flash array controller). The flash array controller 230 has an architecture that allows using some flash array resources with the SoC controller without compromising the secrecy of certain information stored therein (for example, algorithms, flash array voltages, currents, and more in general process information) and guarantees eventual customer return management. This is allowed by the adoption of a special structure wherein the user can write his own firmware in a first area and can interact with the controller internal firmware in a second different area.

The memory component 210 and the host or SoC 200 have been coupled with an interface using a very high parallelism. This feature can be used also to improve the performance, for instance to load the Instruction Register and the (generic) Data Registers.

The need of having a very low initial latency and high throughput is driving the generation of the following scheme for the addressing per sub-array.

Figure 18:
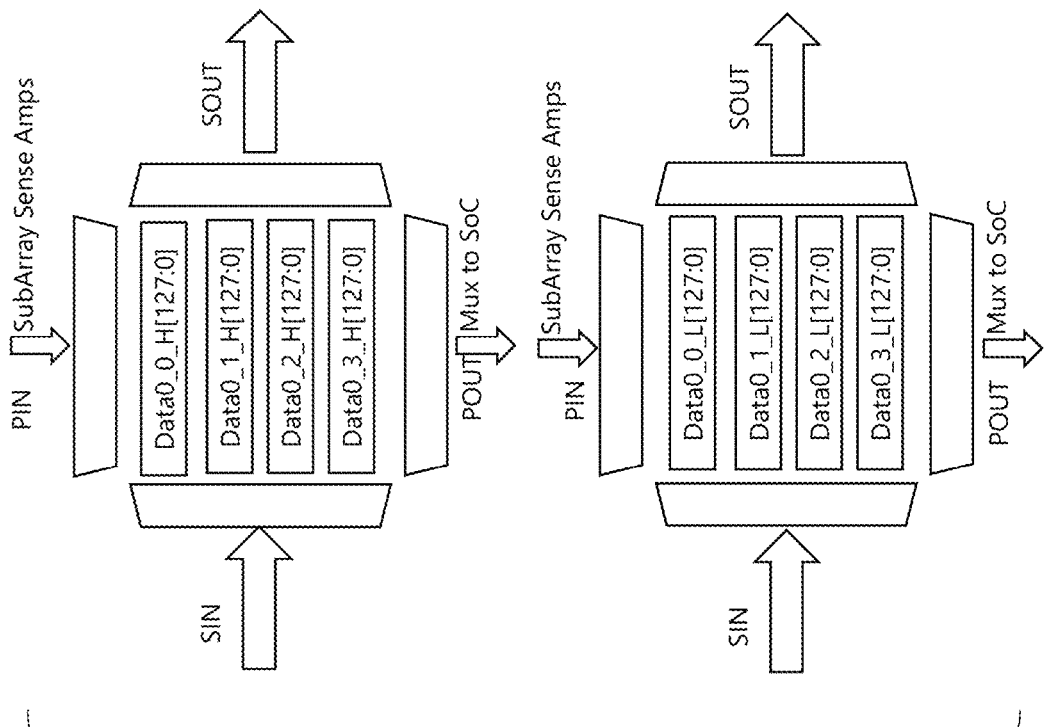
FIG. 18 is a schematic view of a relationship between address and data registers in the memory portion of the present disclosure.
Figure 18:
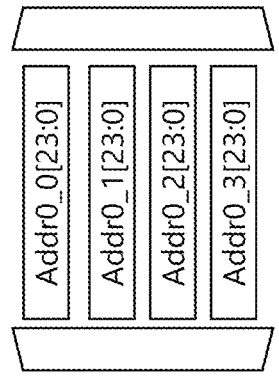
Figure 19:
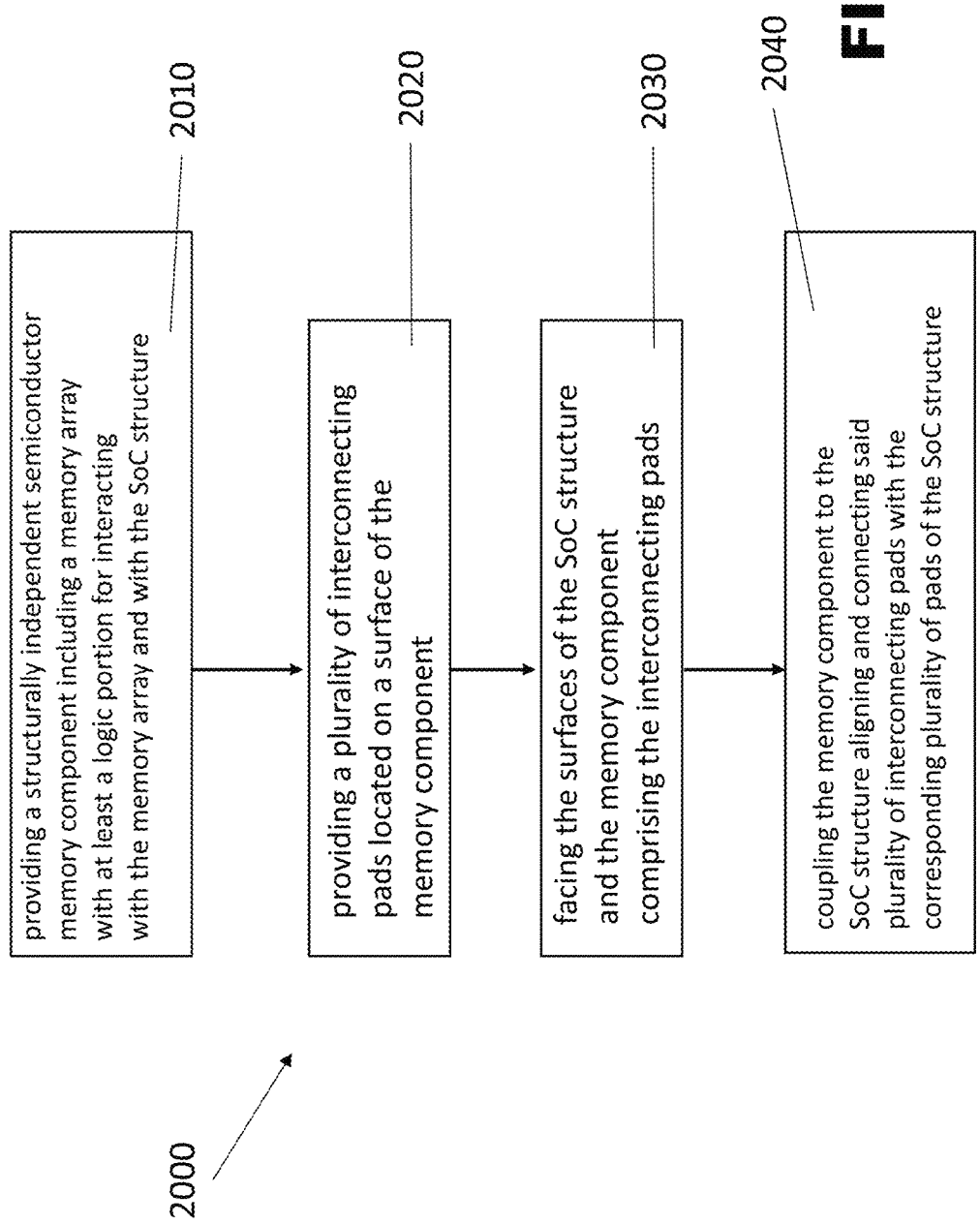
FIG. 19 shows a block diagram illustrating the manufacturing method phases of the present disclosure.

Making reference to the example of FIG. 18, if the SoC 200 needs up to 256 Bits at a time, the data buffers will be duplicated so to be able to shift, assuming to use the address 0 of the sub array 0:

First pass of the first group of Bits: Data 0_0_H [127:0]

Second pass of the second group of Bits: Data 0_0_L [127:0]

The address buffers are made using JTAG Cells.

According to the standard IEEE 1149 and 1532 concerning the JTAG, the protocol IEEE1532 is used as expanded command set to operate in each sub array and the new sub-array structure enables the In-System Programming.

Figure 17:
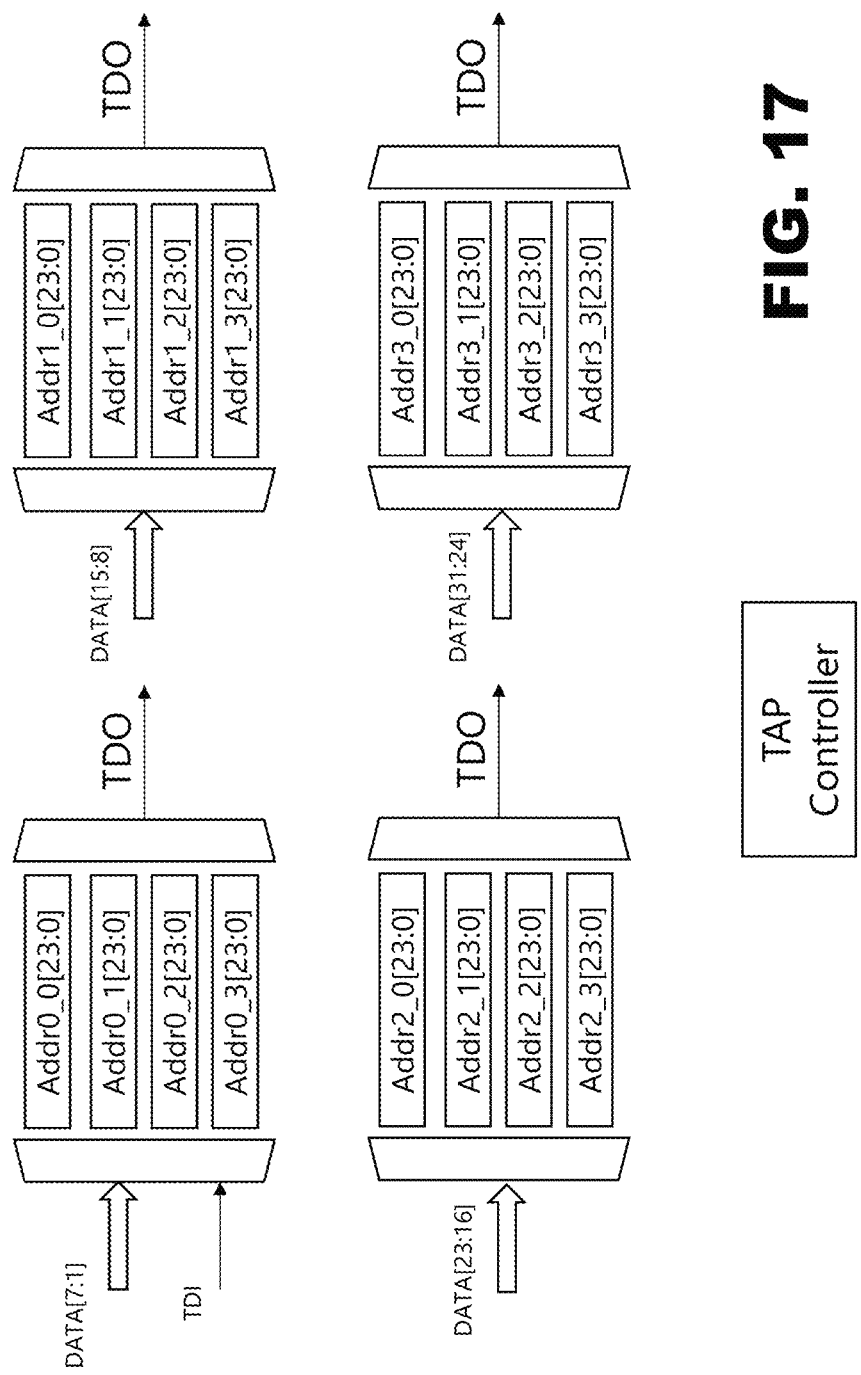
FIG. 17 is a schematic view of a group of address registers for a memory page in the memory portion of the present disclosure.

The need of having a very low initial latency and high throughput is driving the generation of the following scheme for the addressing per sub-array. FIG. 17 shows row address buffers and the corresponding row data buffers in the structure similar to DRAM but here we have adopted the super pages addresses and corresponding data, i.e. 168×2.

The implemented set of instructions to address the memory array implemented can be of two types or two levels of address; in other words:a global instruction selects the sub array while a local instruction selects one of the address register (for instance one of the four) associated with the selected subarray.

Global address loading: in this case all the sub array will receive the address in multiple steps using a command, i.e. load_global_address_0, load_global_address_1, etc.

Local address loading: in this case only the addressed register in the selected sub-array will receive the new address, i.e. local_address_0_0, local_address_0_1, local_global_address_1_3, etc.

Each sub-array will contain a set of 4× data registers, for instance 4× (data+address+ECC registers) corresponding each to an address register. 4× data registers are containing a super page, that is to say: data_H+data_L (having removed the link to the specific address).

The address registers are connected to the address decoder when the read or modify operation are addressing the array. The link is driven by the flash controller in the modify phase while the read finite state machine is linking them when the read is triggered. The address register is loaded using a JTAG finite state machine. when the corresponding instruction, Load Address is recognized and the Shift_DR state is in the JTAG tap then the TDI is connected to the address register.

A Global_Address_Loadx command is used to load at the same time the nibble of eight bits in the corresponding registers:

Global_Address_Load0 in the instruction register generates the load of the addr0_0. This command, for example, can address the sub array 0; similarly, it happens for the selection of the corresponding sub array address registers, addr1_0, addr2_0 and addr3_0 using three TCK cycles when the finite state machine of the JTAG interface is in the Shift DR state.

Local_Address_Load0_0 in the instruction register generates the load of the addr0_0, using three TCK cycles when the finite state machine is in the Shift_DR state. This command, as example, addresses the register 0 of the selected sub array. This means that when the ShiftDR is reached the TDI is connected to the input of this shift register and the TDO to the output, if the flexible TDI is used we need only three clock periods Tck to have the whole address inside the selected address register, otherwise we would need 24 clock periods Tck.

These instructions (Global_Address_Load0, Global_Address_Load1, Global_Address_Load2, Global_Address_Load3) allow the pre-load of the address for all the channels implemented in the flash array. Those four instructions are implemented to select one of the four sub array. In a possible implementation with eight cores, we will need eight commands, one for each core or a method to select one of the cores using one command and a sub array address. Therefore, the introduction of the above command permits to optimize the communication between the SoC structure 10 and the memory component 1 enhancing the transfer performance to the controller The instructions (Local_Address_Load0_0, . . . , Local_Address3_3) allow the use of a single core/channel avoiding the need for the controller to manage the whole set of cores when only one is working; the cores are indipendent and they can use their own channel when it is needed. This instructions serves for selecting one of the address register of the selected sub array.

The implementation of this last disclosed mechanisms ensures the optimization of the read operation of the memory.

For completeness of disclosure we will now make reference to the block diagram example of FIG. 7 wherein the manufacturing phases of a method 2000 according to the present disclosure are reported.

In a first phase 2010 it is provided a structurally independent semiconductor memory component or device including a memory array with at least a logic portion for interacting with the memory array and with the SoC structure.

During the manufacturing phase illustrated in step 2020 a plurality of interconnecting pads located on a surface of the memory component.

Then in step 2030 the surfaces of the SoC structure and the memory component comprising the interconnecting pads are faced one toward the other.

Finally, in step 2040 a coupling phase is performed connecting the memory component and the SoC structure aligning and connecting said plurality of interconnecting pads with the corresponding plurality of pads of the SoC structure.

In the preceding detailed description, reference is made to the accompanying drawings that form a part hereof, and in which is shown, by way of illustration, specific examples. In the drawings, like numerals describe substantially similar components throughout the several views. Other examples may be utilized, and structural, logical and/or electrical changes may be made without departing from the scope of the present disclosure. In addition, as will be appreciated, the proportion and the relative scale of the elements provided in the figures are intended to illustrate the embodiments of the present disclosure and should not be taken in a limiting sense.

As used herein, "a," "an," or "a number of" something can refer to one or more of such things. A "plurality" of something intends two or more. As used herein, the term "coupled" may include electrically coupled, directly coupled, and/or directly connected with no intervening elements (e.g., by direct physical contact) or indirectly coupled and/or connected with intervening elements. The term coupled may further include two or more elements that co-operate or interact with each other (e.g., as in a cause and effect relationship).

Although specific examples have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. The scope of one or more examples of the present disclosure should be determined with reference to the appended claims, along with the full range of equivalents to which such claims are entitled.

What is claimed:

1. An apparatus, comprising:
a System-on-Chip (SoC) structure; and
a memory component comprising:
a controller coupled to a memory array; and
a surface including a plurality of interconnection pads located thereon; and
wherein the SoC structure and an overlapping portion of the memory component are coupled through connection pillars corresponding to the plurality of interconnection pads via a logic over pads technology.

2. The apparatus of claim 1, wherein the memory component and the SoC structure are coupled in a face-to-face manner.

3. The apparatus of claim 1, wherein the memory component comprises a direct memory access capability.

4. The apparatus of claim 1, wherein the memory component comprises a JTAG interface.

5. The apparatus of claim 1, wherein the memory component serves as a replacement for an embedded memory of the SoC structure.

6. The apparatus of claim 1, wherein the memory component is a structurally independent semiconductor device with respect to the SoC structure.

7. The apparatus of claim 1, wherein coupling of the memory component and the SoC structure does not include wire bonding.

8. The apparatus of claim 1, wherein the memory component serves as a memory resource in addition to an embedded memory resource of the SoC structure.

9. The apparatus of claim 1, wherein the memory component comprises a controller coupled to memory array.

10. An apparatus, comprising:
a System-on-Chip (SoC) structure including a plurality of connection pads; and
a memory component overlapping the SoC structure and coupled thereto in a face-to-face manner via a corresponding plurality of connection pads of the memory component;
wherein the memory component implements a direct memory access (DMA) type of memory configured to replace an embedded memory of the SoC structure.

11. The apparatus of claim 10, wherein the memory component comprises a controller coupled to an array of memory cells.

12. The apparatus of claim 11, wherein the memory cells are Flash memory cells.

13. The apparatus of claim 11, wherein the memory component comprises a JTAG interface.

14. The apparatus of claim 10, wherein the memory component is coupled to the SoC structure via respective connection pillars corresponding to the plurality of connection pads of the memory component and the corresponding plurality of connection pads of the SoC structure.

15. The apparatus of claim 10, wherein the SoC structure and the overlapping memory device are coupled through Flip Chip technology.

16. The apparatus of claim 10, wherein an area of the memory component that overlaps the SoC structure is larger than a semiconductor area of the SoC structure dedicated to interconnections with the memory component.

17. The apparatus of claim 10, wherein the memory component is a structurally independent semiconductor device.

18. An apparatus, comprising:
- a System-on-Chip (SoC) structure including a plurality of connection pads; and
- a portion of a memory component overlapping the SoC structure and coupled thereto through connection pillars corresponding to the plurality of connection pads of the SoC structure;
- wherein the SoC structure and the portion of the memory component overlapping the SoC structure are coupled via a logic over pads technology.

19. The apparatus of claim 18, wherein the memory component implements a direct memory access (DMA) type of memory.

20. The apparatus of claim 18, wherein the memory component is a structurally independent semiconductor device and includes a reduced instruction set computer (RISC) controller.

* * * * *